United States Patent [19]
Sato et al.

[11] Patent Number: 5,719,414
[45] Date of Patent: Feb. 17, 1998

[54] PHOTOELECTRIC CONVERSION SEMICONDUCTOR DEVICE WITH INSULATION FILM

[76] Inventors: Keiji Sato; Yutaka Saito; Tadao Akamine; Junko Yamanaka, all of 31-1, Kameido 6-chome, Koto-ku, Tokyo, Japan

[21] Appl. No.: 213,952

[22] Filed: Mar. 16, 1994

[30]  Foreign Application Priority Data

| | | | |
|---|---|---|---|
| Mar. 16, 1993 | [JP] | Japan | 5-056207 |
| Jun. 28, 1993 | [JP] | Japan | 5-157454 |
| Oct. 7, 1993 | [JP] | Japan | 5-251446 |
| Dec. 2, 1993 | [JP] | Japan | 5-302960 |
| Jan. 26, 1994 | [JP] | Japan | 6-007097 |

[51] Int. Cl.$^6$ ................................. H01L 31/107
[52] U.S. Cl. ................ 257/186; 257/438; 257/463; 257/464; 257/627
[58] Field of Search ........................ 257/438, 439, 257/461, 463, 464, 465, 186, 187, 458, 454, 466, 627

[56]  References Cited

U.S. PATENT DOCUMENTS

| | | | |
|---|---|---|---|
| 4,142,200 | 2/1979 | Mizushima et al. | 257/438 |
| 4,160,985 | 7/1979 | Kamins et al. | 257/464 X |
| 4,277,793 | 7/1981 | Webb | 257/436 |
| 4,383,267 | 5/1983 | Webb | 257/438 |
| 4,463,368 | 7/1984 | McIntyre et al. | 257/438 |
| 4,745,451 | 5/1988 | Webb et al. | 257/438 X |
| 4,914,053 | 4/1990 | Matyi et al. | 437/99 X |
| 5,021,854 | 6/1991 | Huth | 257/438 |
| 5,225,032 | 7/1993 | Golecki | 437/100 |
| 5,481,629 | 1/1996 | Tabuchi | 385/35 X |

FOREIGN PATENT DOCUMENTS

| | | | |
|---|---|---|---|
| 342391 | 11/1989 | European Pat. Off. | |
| 430167 | 6/1991 | European Pat. Off. | |
| 55-11537 | 9/1980 | Japan | |
| 56-131942 | 10/1981 | Japan | |
| 57-157564 | 9/1982 | Japan | |
| 59-05681 | 1/1984 | Japan | 257/438 |
| 59-222988 | 12/1984 | Japan | |
| 63-102282 | 5/1988 | Japan | |
| 1309387 | 12/1989 | Japan | 257/464 |
| 2252236 | 10/1990 | Japan | |
| 4196189 | 7/1992 | Japan | |

OTHER PUBLICATIONS

European Search Report, dated Nov. 24, 1995, Appl. No. 94104023.0.

Eric A. Swanson, et al., "Measurements of Natural Radiation Effects in Low Noise Avalanche Photodiode", IEEE Transactions on Nuclear Science, No. 6, pp. 1658–1661.

Primary Examiner—William Mintel
Attorney, Agent, or Firm—Loeb & Loeb LLP

[57]  ABSTRACT

A photoelectric conversion semiconductor device is characterized in that a second conductivity type impurity region is formed in a first conductivity type semiconductor substrate, the second conductivity type impurity region having a depth of 0.1 μm or less and a peak density of $1\times10^{19}$ atoms/cm$^3$ or more. A method of manufacturing a photoelectric conversion semiconductor device is characterized by a step of ion-injecting boron or boron fluoride with a dose amount of $1\times10^{16}$ to $5\times10^{16}$ atoms/cm$^2$ into a semiconductor substrate as an impurity.

6 Claims, 36 Drawing Sheets

4: N$^+$ TYPE IMPURITY
6: ANODE ELECTRODE
7: CATHODE ELECTRODE
DIMENSION b: LENGTH OF LIGHT RECEIVING PORTION
DIMENSION a: LENGTH OF P$^-$ TYPE IMPURITY REGION

RECTANGULAR PARALLELEPIPED PART A
1/4 COLUMU PART B
1/8 SPHERE PART C
DIMENSION a

RADIUS OF CURVATURE R
$X_j \times 0.8$
$X_j$

A

B

C

IMPURITY PROFILE OF C-C' CROSS SECTION

1  N⁻TYPE SEMICONDUCTOR SUBSTRATE
2  P⁺TYPE IMPURITY REGION
3  N⁺TYPE SEMICONDUCTOR REGION
4  N⁺TYPE IMPURITY REGION
5  SiO₂ FILM
6  ANODE ELECTRODE
7  CATHODE ELECTRODE
8  CATHODE ELECTRODE

513 SiO2　514 NATURAL OXIDE FILM　511 P⁻ TYPE SUBSTRATE
512 P TYPE IMPURITY REGION

517 ACTIVE SURFACE

515 BORON SILICIDE FILM

516 P TYPE IMPURITY REGION 5,719,414

PHOTOELECTRIC CONVERSION SEMICONDUCTOR DEVICE WITH INSULATION FILM

BACKGROUND OF THE INVENTION

The present invention relates to a photoelectric conversion semiconductor device and a method of manufacturing such a device, the photoelectric conversion semiconductor device being used for measurement of not only light having a wavelength of 100 to 1200 nm, but also x-rays, radiation and charged particles.

In general, such photoelectric conversion semiconductor devices include all semiconductor devices which are variously named such as a photodiode, a pin diode, an avalanche photodiode, a photodiode array, a photosensor, a microstrip sensor, a double-sided microstrip sensor, a radiation sensor, a semiconductor photosensor, a semiconductor image sensor device, a semiconductor image pickup device, and the like.

The present invention relates to a structure which realizes an improvement in performance of these semiconductor devices, and a manufacturing method for achieving such an improvement.

(Discussion of the Related Art)

A conventional semiconductor of this type is shown in FIG. 24 and includes an $n^-$ type semiconductor substrate 1 which is a first conductivity type semiconductor substrate provided with a $p^+$ type conductivity impurity region 2 which is a second conductivity type semiconductor impurity region.

As shown, if a side (surface) where the $p^+$ type impurity region 2 exists is the front surface of the semiconductor device, then an $n^+$ impurity region 3 whose density is higher than the substrate exists at the rear surface of the semiconductor device so as to form a p-n junction of $p^+$-$n^-$-$n^+$ structure. This type of semiconductor device is called a pin diode.

A semiconductor device in which the impurity density of the $n^-$ type semiconductor substrate 1 is in the range of $1 \times 10^{12}$ atoms/cm$^3$ to $1 \times 10^{13}$ atoms/cm$^3$ (hereinafter omitting "atoms/cm$^3$" when referring to the density, and indicating $1 \times 10^{12}$ as 1E12) is called "pin" device, the letter "i" designating an intrinsic semiconductor.

With respect to the notations $n^-$, $n^+$, $p^+$ and the like, the sign "−" designates an impurity density lower than that of n or p, and the sign "+" designates an impurity density higher than that of n or p for the respective conductivity type impurity.

The $p^+$ type impurity region has the impurity density of 1E19 to 7E19 and the depth Xj of the diffused layer (the so-called distance to the p-n junction portion in a longitudinal direction) is 0.5 to 2.0 μm. The $n^+$ type impurity region also has the impurity density of 1E19 to 1E21 and the depth Xj of the diffused layer is 0.5 to 2.0 μm.

A cathode electrode 7 may be at the same surface as the $p^+$ type impurity region 2.

An i layer has a low impurity density and a thickness of several tens to several hundreds μm, and has widely been used because it is suitable for a high speed response in view of the facts that the extent of a depletion layer is large, the range of energy of light or radiation to be detected can be made large, and a relatively large bias can be applied whereby the junction capacitance is small at this time.

FIG. 25A is a diagram showing a state of an impurity density distribution of the pin structure in the conventional semiconductor (hereinafter referred to as an "impurity profile"), which corresponds to the impurity profile of a section taken along line D–D' of FIG. 24. The depth Xj is 0.5 μm and the impurity density is 1E19. It is understood from FIG. 25A that the density is slightly lowered at an interface between $SiO_2$ and Si because of segregation of boron.

FIG. 25B is a diagram showing a distribution of electric field intensity representative of a depletion layer (space-charge layer) expanded in a p-n junction in the depthwise direction of the layer when a reverse bias voltage is applied to a conventional semiconductor device.

An electron hole pair produced by incident light or radiation is detected as a current so that signal produced by the incident radiation absorbed by the depletion layer greatly contributes to the current.

For example, in the case where such incident radiation is incident from the side of the $p^+$ type impurity regions, when the energy is high such that its wavelength is less than 500 nm, although most of the $p^+$ type impurity region absorbs the incident radiation, it forms an insensitive layer 9 which does not contribute to the generation of a signal current, so that the thickness of this layer causes a significant difficulty.

The pin diode having the $p^+$ type impurity region whose depth Xj is 0.5 μm has a quantum efficiency less than 50% when its wavelength is less than 500 nm.

This lowered quantum efficiency is improved by making the depth Xj as shallow as possible, which is achieved by lowering the dose amount. However, if the dose amount is lowered, then the depletion layer which extends toward the $p^+$ type impurity region is widened. When the widened depletion layer reaches the overall $p^+$ type impurity region, a breakdown (a junction breakdown) is developed by a so-called reach-through, thereby causing a lowered breakdown voltage. Even though the breakdown is not generated, the leakage current from the same bias is increased, and the leakage current causes noise during current detection. This is not desirable.

Further, FIG. 6A is a schematic diagram representing the $p^+$ type impurity region in three dimensions. In general, it is considered that the radius of curvature of the diffused layer at an end portion of the impurity region greatly contributes to the breakdown voltage. A bias of approximately several tens to one hundred and several tens of V is applied to the pin diode for use. The radius of curvature R is set to 0.5 μm or more in order to ensure a suitable breakdown voltage.

FIG. 36 is a schematic sectional view showing a semiconductor device which is called an avalanche photodiode, and as shown in FIG. 36, there are formed, on the front surface of a $p^-$ semiconductor substrate 361, an $n^+$ type impurity region 362 where the diffusion depth at the edge is made deep to heighten a breakdown voltage and a $p^+$ type impurity region 363 which is a channel stopper being apart from the $n^+$ type impurity region 362 and surrounding its periphery on the surface of the $p^-$ semiconductor substrate 361. A p type impurity region 364 which generates an electron avalanche for amplification is formed under the $n^+$ type impurity region 362. On the other hand, a rear $p^+$ type impurity region 366 is provided at a rear surface of the $p^-$ semiconductor substrate 361.

In fact, there is used a semiconductor substrate (hereinafter referred to as an "FZ epitaxial substrate") which provides a $p^-$ epitaxial layer (hereinafter referred to as an epitaxial layer) produced by subjecting $p^-$ Si to epitaxial growth on a $p^+$ semiconductor substrate which has been manufactured by the floating zone method.

Light, electromagnetic radiation, or the like is incident on a surface at the side of the $n^+$ type impurity region 362, and mainly the depletion layer in the substrate has electrons and electron holes generated. The electrons and the electron holes are amplified by avalanche breakdown in the p type impurity region 364.

The avalanche photodiode thus organized has the features of a high sensitivity and a high speed.

In the conventional photoelectric conversion semiconductor device, because of the above-described structure and the manufacturing method, there are fundamentally problems such that a large amount of leakage current flows and the sensitivity to shorter wavelengths is low.

Moreover, the avalanche photodiode constituted by the above-described semiconductor substrate has shortcomings, as particularly stated below.

In the case of an FZ epitaxial substrate structure, because the oxygen content of the substrate is small, the physical strength is weak, and therefore, the substrate is deformed (wafer warp) by heat treatment during manufacture and dislocation slip is increased. This causes such problems that yield is lowered and the characteristics of the manufactured device are deteriorated.

Furthermore, in the case where x-rays and the like are detected by the avalanche photodiode, since the $p^+$ impurity region 366 at the side of the rear surface shown in FIG. 36 constitutes a diffusion region of incident radiation, it is preferable to make its width as short as possible. However, even if the epitaxial substrate is ground at its rear surface so as to be made thin, in order to make the contact resistance with anode electrode 365 low, a region b forming a diffusion portion from a grounding substrate exists when performing the epitaxial growth as shown by a schematic impurity profile of the FZ epitaxial substrate section in FIG. 37, and therefore the width cannot be made thinner than some limit.

Because the region b forms a portion with a smooth profile of at least several μm length, a current flows due to the fact that carriers generated in this region are diffused in the depletion layer with a delay in addition to a current which is caused by carriers which generate in the depletion layer when x-rays are incident. As a result, there is a problem that the time resolution of the avalanche photodiode is lowered.

If the FZ substrate having a thickness of several 10 μm is used to make the thickness of the $p^+$ type impurity region thin, the above-mentioned problem of time resolution is preventable. However, because the substrate is thin, the physical strength is weaker than that of the usual FZ substrate with the result that the yield is lowered and the device performance is lowered, which are caused by the warp of a wafer during a heat treatment process and the increase in dislocation slip becoming more severe.

As shown in another prior art example of FIG. 38, in a case where a $p^+$ type impurity region is formed after a $p^-$ epitaxial layer 381 has been exposed by making a part of an FZ substrate 382 thin by etching or grinding, the above-mentioned problems of mechanical strength and time resolution are improved.

However, it is difficult to control the thickness d of the remaining $p^-$ epitaxial layer portion with high accuracy.

Further, because the avalanche photodiode with the above-mentioned structure has a large potential gradient of the p type impurity region and is liable to produce a breakdown, the $n^+$ type impurity region and p type impurity region are in the form of a circle. However, the uniformity of the amplification factor inside of the circle is poor and dispersed.

SUMMARY OF THE INVENTION

An object of the present invention is to solve the above-mentioned problems with the conventional avalanche photodiode.

Another object of the present invention is to cause a light detection function to have a two-dimensional characteristic in the avalanche photodiode.

In order to achieve the above objects, the present invention provides the following means.

As a first means, when forming a $p^+$ type impurity region in an $n^-$ type substrate, its depth is set to 0.1 μm or less and its peak density is set to 1E19 or more, preferably 1E20 or more.

Further, it is preferable that the $p^+$ type impurity region has a density peak at the surface of a semiconductor substrate.

As a second means, in addition to the first means, the depth Xj of a part of the $p^+$ type impurity region with which an electrode is brought into contact (ohmic contact) is 0.5 μm or more.

As a third means, in addition to the first means, a boron silicide (SiB4 to SiB6, boron density is 70% or more) layer is formed with a thickness of 200 Å to 1000 Å).

As a fourth means, when forming a $p^+$ type impurity region in a $p^-$ substrate, its depth is set to 0.1 μm or less and its peak density is set to 1E19 or more.

As a fifth means, an element beam of boron fluoride is selected, and a dose amount of 1E16 to 5E16 BF2 or BF3 is injected as the ion injection material for the formation of a $p^+$ type impurity region.

As a sixth means, in addition to the fifth means, after ions have been injected into the $p^+$ type impurity region, annealing is performed at a temperature of 700° to 850° C., or is performed at a temperature of 1050° to 1100° C. for 5 to 10 seconds by the RTA method (instant heating method using a halogen lamp).

As a seventh means, there is provided a manufacturing method in a process of forming a $p^+$ type impurity region, which comprises a step of exposing a chemically active surface by removing a natural oxide film on the surface of a semiconductor substrate, a step of supplying a compound containing a gas-phase boron element to the active surface to form a boron element or boron compound layer, and a step of performing a solid-phase diffusion and activation of the impurity with this layer which forms an impurity diffusion source.

The present inventors have studied the improvement of sensitivity to the shorter wavelength region, and consequently have found that the face orientation of a semiconductor substrate greatly affects the sensitivity.

That is, in order to solve the above problems, according to the present invention, as an eighth means, A Si semiconductor substrate of a face orientation (100) is used as a semiconductor substrate.

Furthermore, as a ninth means, in addition to the eighth means, the resistivity of the semiconductor substrate is set to 100 Ω.cm or more, preferably 1 k Ω.cm or more.

As a tenth means, in addition to the eighth means, the conductivity of the semiconductor substrate is of the n type.

As an eleventh means, by using a substrate (hereinafter referred to as an "FZ-SOI substrate") to which a silicon semiconductor substrate (an FZ substrate) which has been crystal-grown by the floating zone method is affixed, an avalanche photodiode is formed on the FZ substrate.

As a twelfth means, instead of $p^+$ type impurity region in a rear surface, a Semi-Insulating-Polycrystalline Silicon layer (SIPOS) is provided on the avalanche photodiode.

As a thirteenth means, in addition to the eleventh means, a CZ substrate is used as a support substrate.

As a fourteenth means, in addition to the eleventh means, in at least a part of portions immediately under the p-n junction in the FZ substrate, the support substrate is removed.

As a fifteenth means, in addition to fourth means, the thickness of the $p^+$ type impurity region in a rear surface which is exposed on the removed part of a support substrate under a p-n junction is decreased. Preferably this process is used after a heat treatment process such as a diffusion of an impurity.

As a sixteenth means, in addition to the fourteenth means, a substrate of a face orientation (100) is used as a support substrate.

As a seventeenth means, in addition to the fourteenth means, the doping of an impurity is made on a part or all of the surface of the portion where the support substrate of the FZ substrate has been removed.

As an eighteenth means, at least a part of the p type impurity region of the FZ substrate is formed by performing a step of removing a natural oxide film of a semiconductor substrate surface to expose a chemically active surface, a step of forming a boron element or boron compound layer, and a step of performing a solid-phase diffusion and the activation of an impurity with that layer which forms an impurity diffusion source.

The present inventors have researched the distribution of the amplification factor of the avalanche photodiode, and have found that a region of a square portion which is inscribed with a circular impurity region has a reduced dispersion of the amplification factor, which does not obstruct stripping.

Therefore, in the present invention, as a nineteenth means, at least one of a $p^+$ type impurity region and an $n^+$ type impurity region is divided in the form of a strip.

As a twentieth means, in addition to the nineteenth means, there is used a silicon substrate which is joined to a support substrate with an insulation film.

As the support substrate, in particular, it is preferable to use a silicon substrate which has been crystal-grown by the Czochralski method.

As a twenty-first means, avalanche photodiodes formed by dividing at least one of the impurity regions on the surface into strips are laminated.

With the above-mentioned means, the following operations are obtained.

With the first means, since the density of the $p^+$ type impurity is made high, expansion of the depletion layer toward the $p^+$ type impurity region side can be restrained thereby to reduce the leakage current. Further, since the depth Xj of the $p^+$ type impurity region is made shallow, quantum efficiency can be improved at the shorter wavelength side.

With the second means, even though the depth Xj of the $p^+$ $p^+$ type impurity region at the light receiving portion is made shallow, a good electrode contact can be obtained.

With the third means, when neutrons are incident, they nuclear-react with boron so as to be converted into x-rays and Li nuclei, thereby enabling the detection of neutrons.

With the fourth means, the scattering of incident radiation is reduced.

With the fifth means, a $p^+$ type impurity region having a shallow depth Xj can be formed.

As the sixth means, a $p^+$ type impurity region having a shallower depth Xj at a high density can be formed.

As the seventh means, a $p^+$ type impurity region having a shallower depth Xj at a high density and not having any residual damages at all can be formed.

By using a Si semiconductor substrate of a face orientation (100) as in the eighth means, the sensitivity in the region of shorter wavelengths is improved.

The use of a Si semiconductor substrate of the face orientation (100) is advantageous in forming a MOS, and it is possible that a variety of circuit elements such as a logic circuit, a memory circuit and a drive circuit, etc. are formed on the identical substrate to provide a variety of functions, thereby increasing the degree of high integration.

With the ninth means, the S/N can be improved.

With the tenth means, in the case where B or the like is used as an impurity, thereby making it difficult to manufacture a shallow junction, the sensitivity particularly in the shorter wavelength region is improved.

With the eleventh means, even though the FZ substrate is thin, the physical strength can be made great and the diffusion region for receiving incident radiation can be made thin.

With the twelfth means, forming a shallow Semi-Insulating Polycrystalline Silicon layer by CVD, an interface with a between $p^-$ semiconductor substrate has a negative charge and storage holes. It has the same effect as forming a shallow $p^+$ type impurity region. Then the transmittance of incident radiation can be improved.

With the thirteenth means, the occurrence of the deformation of a substrate (warp of a wafer) and dislocation slip during a heat treatment in a process of manufacturing an avalanche photodiode can be reduced.

With the fourteenth means, in addition to reduction in occurrence of the dislocation slip during the heat treatment process of the FZ substrate, the scattered region of incident radiation can be made thin. Further, electron radiation or the like can be incident from a side where a support substrate of the FZ substrate is removed.

With the fifteenth means, in addition to the fourteenth means, by decreasing the thickness of the $p^+$ type impurity region in a rear surface, transmittance of incident radiation can be improved.

With the sixteenth means, anisotropic etching can be used so that a process of removing the support substrate is facilitated.

With the seventeenth means, a process of doping an impurity at a side where the support substrate of the FZ substrate is removed can be performed after other impurity doping processes, whereby a shallower diffusion layer can be formed.

With the eighteenth means, a very shallow diffusion layer can be formed on the FZ substrate.

With the nineteenth means, a light detection function can be performed one-dimensionally (linearly). Further, a $p^+$ type impurity region 2 and an $n^+$ type impurity region 3 (FIG. 1) are simultaneously made in the form of strips that are transverse to each other, thereby enabling the formation of a two-dimensional sensing structure.

With the twentieth means, in the case where a thin $p^-$ type semiconductor substrate made of silicon is used, the occurrence of deformation, defects and the like during manufacturing can be restrained, and a plurality of fine strips can be formed.

With the twenty-first means, a substrate in which one of the $p^+$ type impurity region and the $n^+$ type impurity region are divided into strips, or both are simultaneously divided into strips so that they are in parallel with each other, is laminated so that light or the like is incident from a side of the laminated substrate, thereby giving the light detection function a two-dimensional form. In particular, in this case, the detection region of incident radiation can be made deep, thereby being effective energetic radiation such as x-rays and the like.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the invention and together with the description, serve to explain the principles of the invention.

BRIEF DESCRIPTION OF THE DRAWING

FIGS. 6A to 6E are schematic diagrams showing a $p^+$ type impurity region three-dimensionally, in which FIG. 6A is a diagram showing the whole appearance; FIG. 6B is a diagram showing an end portion of the impurity region, and FIGS. 6C to 6E are diagrams showing exploded parts of the impurity region in FIG. 6A, respectively;

FIGS. 10A and 10B are diagrams showing the impurity profile of boron formed by ion injection, respectively, in which FIG. 10A shows the impurity profile after the ion injection, and FIG. 10B shows the impurity profile after annealing;

FIGS. 21A and 21B are diagrams showing a pixel structure in a semiconductor device of an example to which the fifth embodiment of the present invention is applied, respectively, in which FIG. 21A is a schematic sectional view and FIG. 21B is a schematic circuit diagram;

FIGS. 25A and 25B are diagrams showing a state of a pin structure in the depthwise direction in the conventional semiconductor device, in which FIG. 25A shows a state of an impurity density distribution, and FIG. 25B shows a state of an electric field intensity representative of a depletion layer (space-charge layer) expanded to a p-n junction when a reverse bias voltage is applied to the semiconductor device;

DETAILED DESCRIPTION OF THE PREFERRED EMBODIMENTS

Now, embodiments of the present invention will be described in detail with reference to the accompanying drawings.

Figure 1:
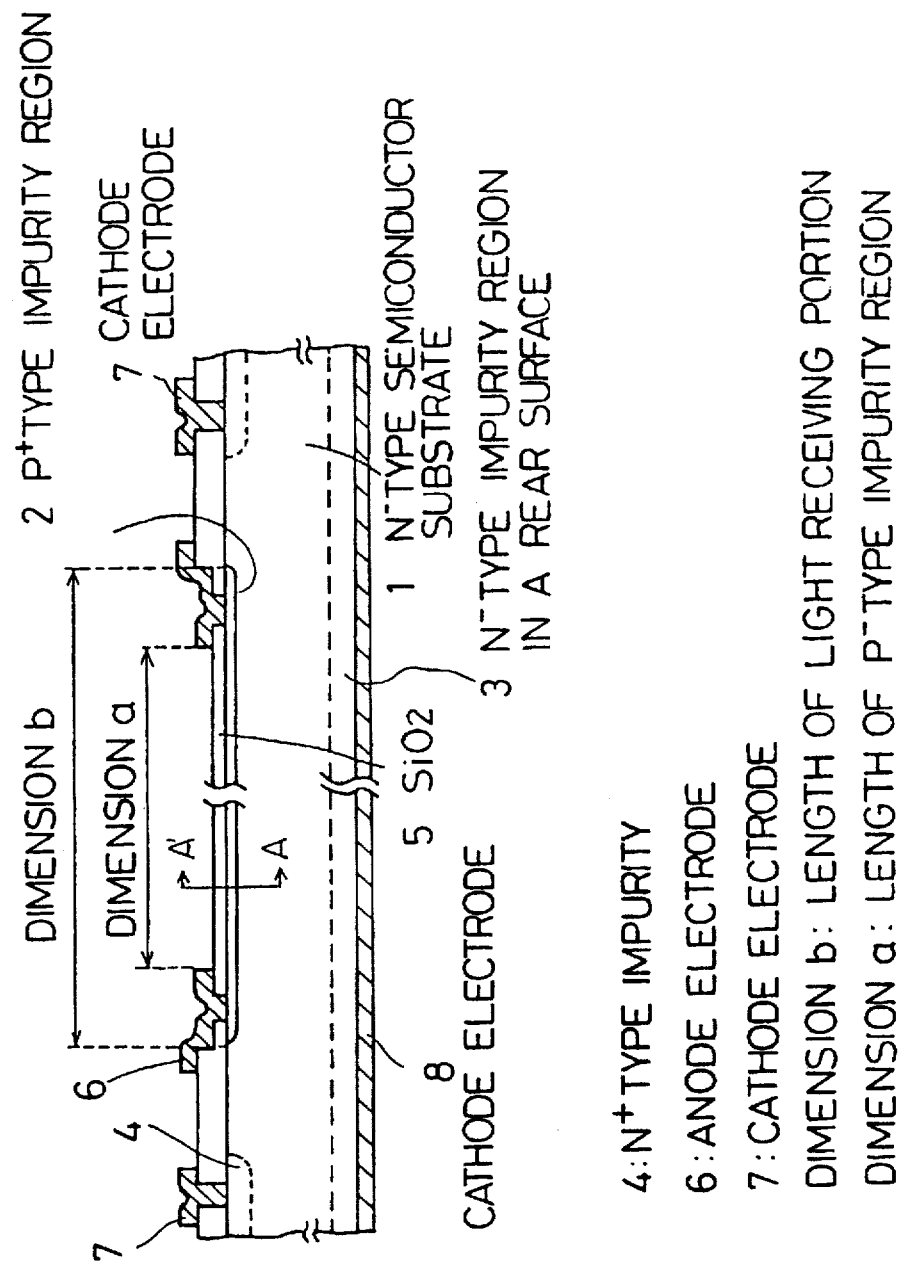
FIG. 1 is a schematic sectional view showing a pin diode in a semiconductor device in accordance with a first embodiment of the present invention.

FIG. 1 is a schematic sectional view showing a pin diode in a semiconductor device in accordance with a first embodiment of the present invention. In this invention, the dimension a in the figure defines a semiconductor device having the length of 2 mm or more.

A $p^+$ type impurity region 2 having a depth of 0.1 μm or less and a peak density of 1E20 is formed in the surface of an n-semiconductor substrate 1. the peak density of region 2 approaches as close to the surface of the substrate 1 as possible.

Figure 2:
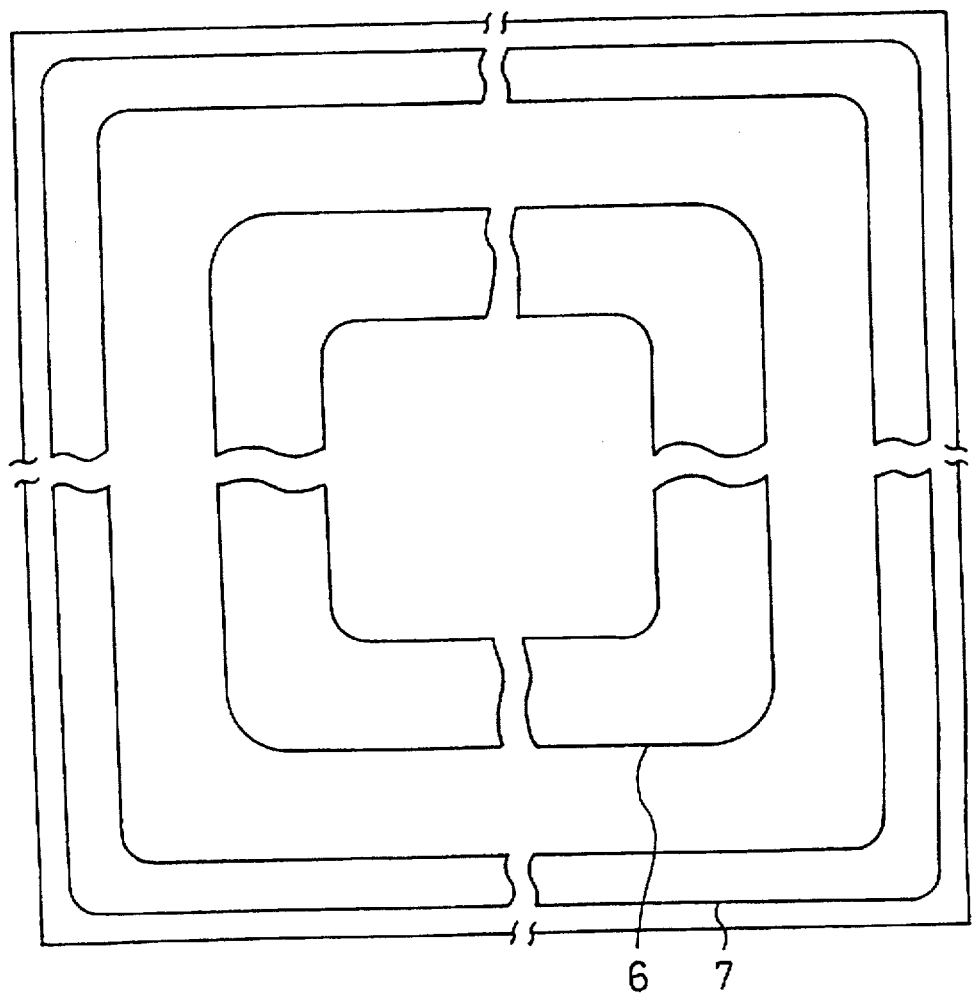
FIG. 2 is a schematic plan view showing the pin diode in the semiconductor device in accordance with the first embodiment of the present invention.
Figure 3:
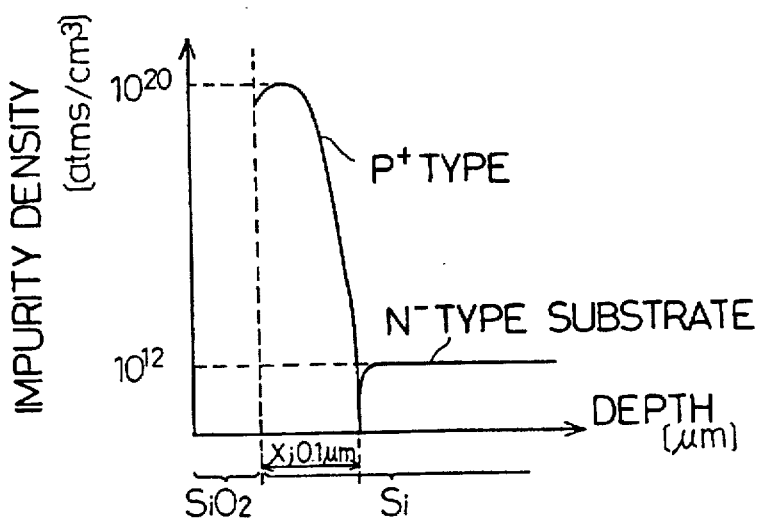
FIG. 3 is a diagram showing an impurity profile of the pin diode in the semiconductor device in accordance with the first embodiment of the present invention.

FIG. 2 is a schematic plan view showing a pin diode in the semiconductor device in accordance with the first embodiment of the present invention. FIG. 3 is a graph showing an impurity profile of the pin diode in the semiconductor device in accordance with the first embodiment of the present invention, which is a profile of a section taken from the line A-A' in FIG. 1.

As is apparent from the graph, the $p^+$ type impurity region is so constituted as to have a peak density of 1E20 and the depth Xj of 0.1 μm.

Figure 4:
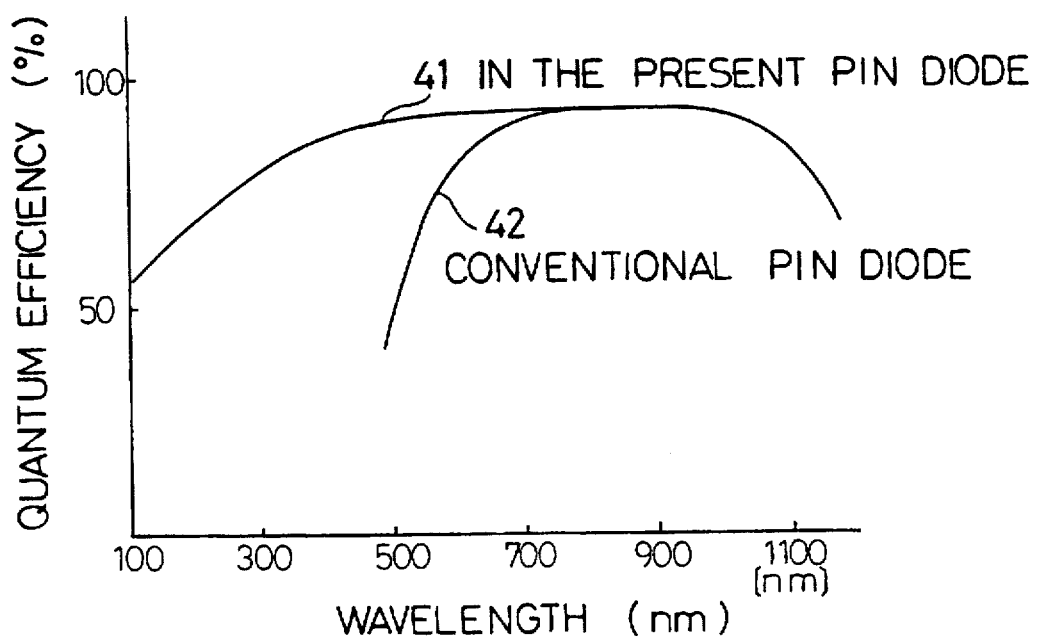
FIG. 4 is a diagram showing the spectral characteristics of quantum efficiency of Si with respect to light wavelength.

FIG. 4 is a graph showing the spectral characteristics of quantum efficiency of Si with respect to light wavelength. In the graph, a curve 42 represents the wavelength-quantum efficiency characteristics of a conventional pin diode having a $p^+$ type impurity region whose depth Xj is 0.5 μm in which the quantum efficiency is less than 50% when the wavelength is less than 500 nm (hereinafter, sometimes referred to as a "sensitivity of a shorter wavelength side"). On the contrary, a curve 41 represents the wavelength-quantum efficiency characteristics of a pin diode having a $p^+$ type impurity region in accordance with this embodiment, in which, even though the wavelength is 100 μm, a quantum efficiency not less than 50% can be obtained.

Figure 5:
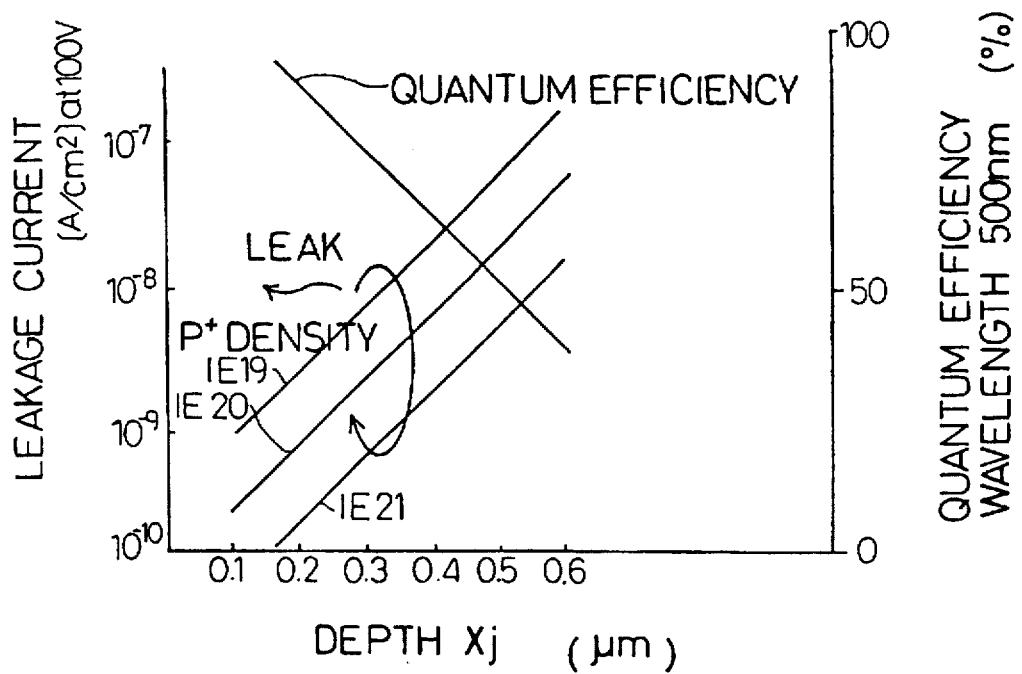
FIG. 5 is a diagram representative of a reverse leakage current in a $p^+n$-junction with respect to Xj by impurity density which forms a parameter.

FIG. 5 is a graph representative of a reverse leakage current in a $p^+$-$n^-$ junction with respect to the depth Xj by an impurity density which forms a parameter, together with the quantum efficiency.

For example, if there is a requirement for achieving the necessary S/N that a leakage current is set to 1 nA/cm² or less and the quantum efficiency is set to 50% or more (wavelength 500 nm), a line representative of the $p^+$ density 1E19 can satisfy the above condition at the lowest value when Xj is 0.1 μm or less. The depth Xj must be 0.2 μm or less in the case of a line representative of the $p^+$ density 1E20, and Xj must be 0.35 μm or less in the case of a line representative of the $p^+$ density 1E21, in order to satisfy the above condition. Concerning the effect of doping (forming an impurity region) and controllability at manufacturing, preferably $p^+$ density is 1E20 or more.

Figure 6A:
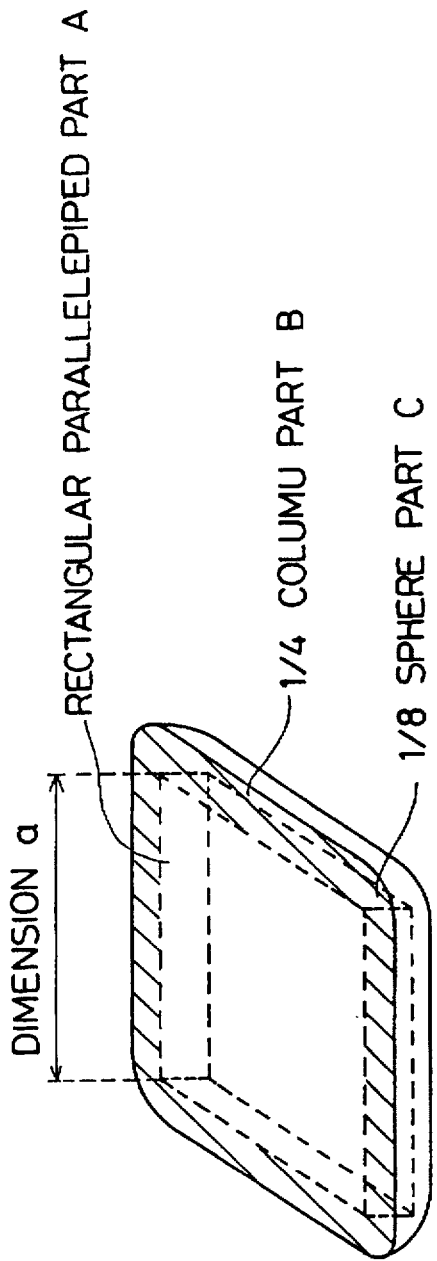
Figure 6B:
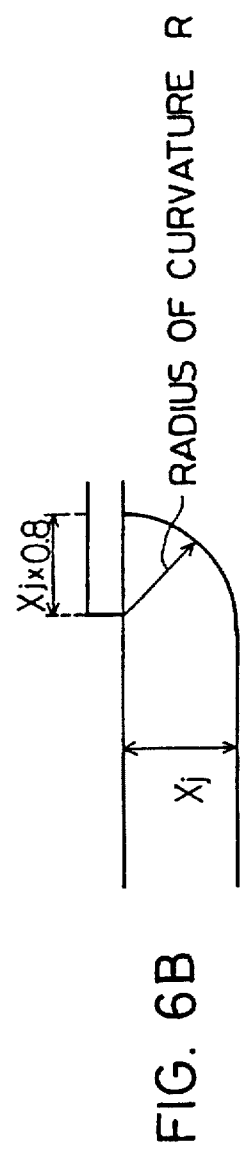

FIGS. 6A to 6E are schematic diagrams showing a $p^+$ type impurity region three-dimensionally, respectively, in which FIG. 6A shows its whole appearance, and FIG. 6B shows a radius of curvature R of a diffusion layer on an end portion of the impurity region. In general, it is considered that this radius of curvature R largely contributes to the breakdown voltage, and the pin diode and the like are used by applying a bias of approximately several tens to one hundred and several tens V. It had been considered in general that R of 0.5 μm or more is required in order to ensure the breakdown voltage of several tens V. A leakage current at 100 V also similarly suffers from the above situation. There has been a problem that a large leakage current is caused by an electric field concentration at a portion having such a curvature.

Figure 6C:
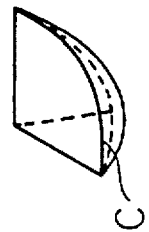
Figure 6D:
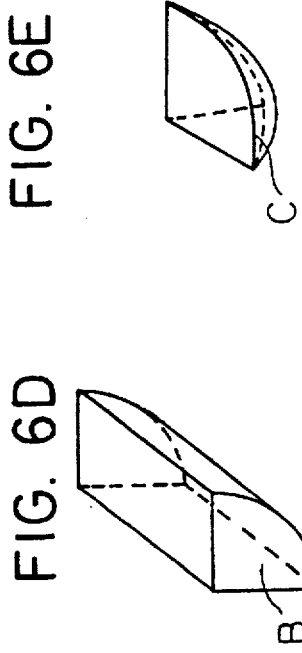
Figure 6E:
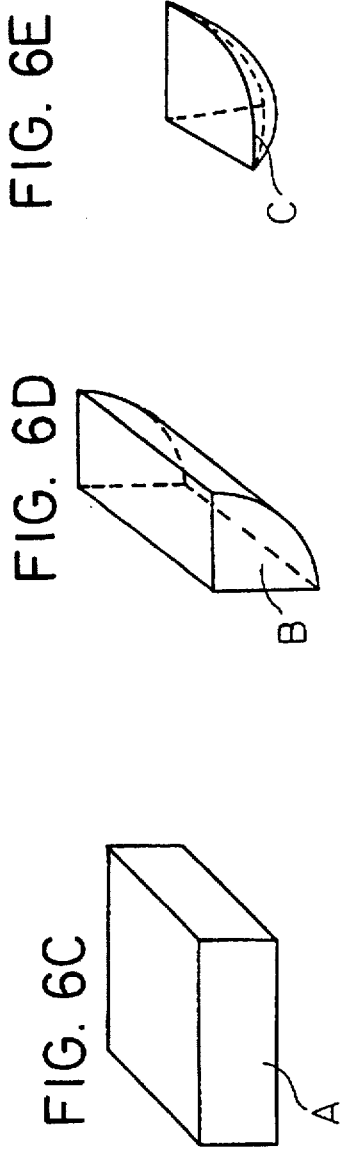

FIGS. 6C to 6E show a $p^+$ type impurity region of FIG. 6A which has been exploded part by part, respectively. In the figures, parts B and C suffer from the problem of lowering breakdown voltage and increase of leakage current due to the curvature as described above. However, this invention is made for a semiconductor device of a relatively large area, that is, for a semiconductor having the dimension a of 2 mm or more in FIG. 6A. The above-mentioned problems are not applicable to such a semiconductor device having a large area, and therefore the present invention becomes extremely effective.

In the relationship of the respective parts three-dimensionally, the semiconductor device having such a construction that the dimension a is approximately 20,000 times as large as the depth Xj is effective in solving the above-mentioned problems, and the graph shown in FIG. 5 and the like is applicable to the semiconductor devices with those constructions.

By the way, a process of manufacturing a semiconductor device will be described for a construction which satisfies the depth Xj and a temperature as described above with reference to FIG. 5.

As a first step, boron is ion-injected, or ion implanted, with a dose amount of 3E15 to 1E16, and then annealing is performed at 700° to 850° C. for approximately 30 minutes, or at 1050° to 1100° C. for 5 to 10 seconds by RTA.

As a second step, $BF_2$ or $BF_3$ is ion-injected with a dose amount of 1E15 to 5E16, and then annealing is performed at 800° to 850° C. for approximately 30 minutes or performed at 1050° to 1100° C. for 5 to 10 seconds by RTA.

As a third step, in a process of forming a $p^+$ type impurity region, there is provided a manufacturing method which includes a step of removing a natural oxide film from a surface of a semiconductor substrate to have a chemically active surface exposed, a step of supplying a compound containing a boron element in the gas state to this active surface to form a boron element or boron compound layer, and a step of performing a solid-phase diffusion and activation of the impurity with this boron layer which forms an impurity diffusion source.

FIGS. 12A to 12E are schematic sectional views showing the process order in a manufacturing process for formation of a $p^+$ type impurity region in accordance with the present invention.

Figure 12A:
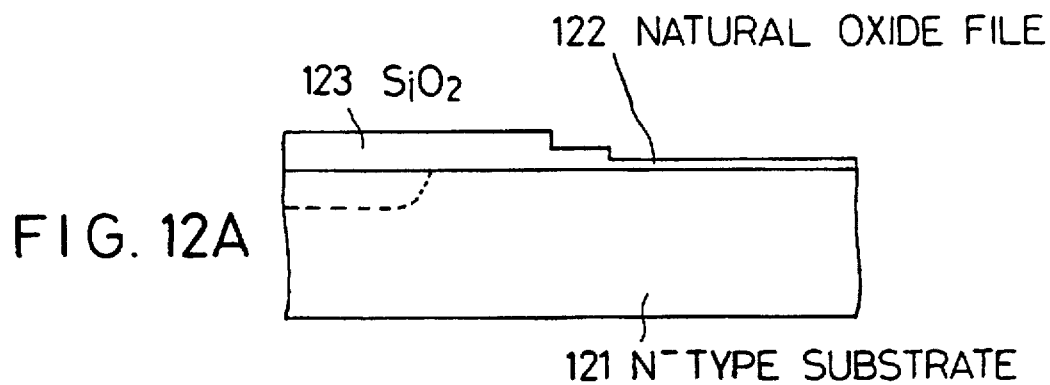
FIGS. 12A to 12E are schematic sectional views showing the process order of a manufacturing process for forming a $p^+$ type impurity region in accordance with the present invention.
Figure 12B:
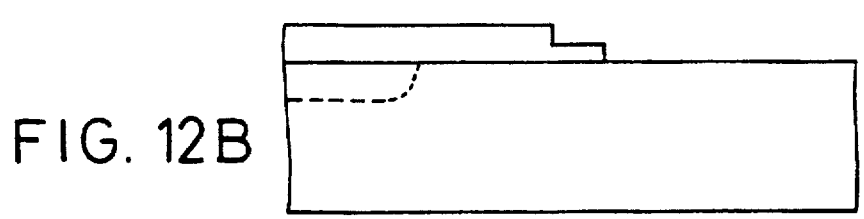

An $n^-$ type semiconductor substrate 121 is disposed at the center of a vacuum chamber having a background pressure of $10^{-4}$ Pa or less. At a substrate temperature of, for example, 850° C., hydrogen gas is introduced into the vacuum chamber for a given period of time under the condition that, for example, the pressure inside of the vacuum chamber becomes $1.3 \times 10^{-2}$ Pa. As a result, a natural oxide film 122 which has been formed on the $n^-$ type semiconductor substrate 121 is removed thereby to expose a silicon surface which is chemically active (FIG. 12B).

Subsequently, a boron compound gas such as $B_2H_6$ gas is introduced to the active surface to form a boron or boron silicide layer thereon.

Figure 12C:
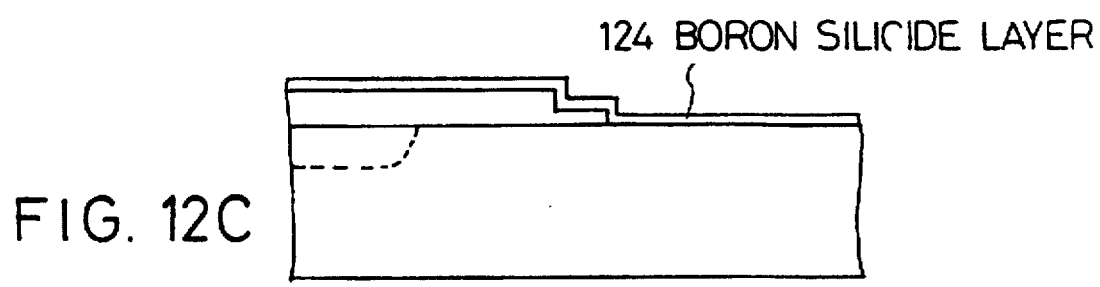

The substrate temperature is set to, for example, 825° C., and after it reaches the set temperature, diborane ($B_2H_2$), which is a compound containing boron, is introduced to the surface of the silicon substrate for a given period of time under the condition that, for example, the pressure inside of the chamber becomes $1.3 \times 10^{-2}$ Pa, thereby to form the boron silicide layer 124 (FIG. 12C).

In this process, $B_2H_6$ gas is introduced in such a manner that the product of $B_2H_6$ gas introduction pressure and introduction time becomes 4.3 Pa.sec or more, resulting in doping with a high controllability.

In the case where the substrate temperature is 300° to 700° C. when $B_2H_6$ gas is introduced, a boron silicide layer is formed if the boron film is at 700° C. or more.

Both the boron film and the boron silicide layer are formed so as to have a thickness of 10 nm or less, respectively, and the diffusion directed from their diffusion source to the substrate becomes a diffusion of a constant surface density which is determined by a solid melting limit at the diffusion temperature, thereby enabling uniform doping with a high controllability.

A deposit of the born film is performed by heat CVD, however the formation of the boron silicide is caused by reaction of boron and Si within the $B_2H_6$ gas, which is different from the usual CVD.

The boron silicide layer is more suitable than a boron film, and the former can perform a diffusion with controllability higher than the latter.

Figure 12D:
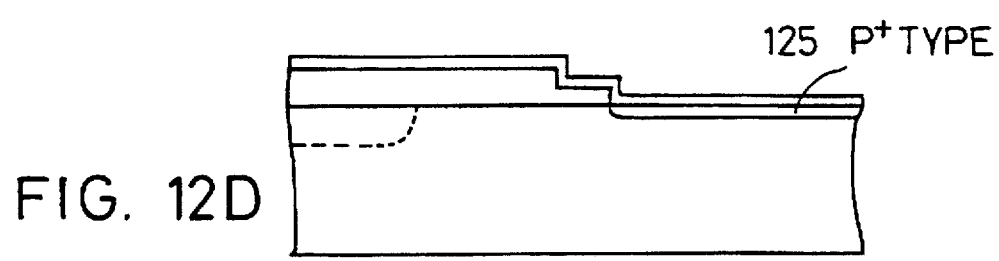
Figure 12E:
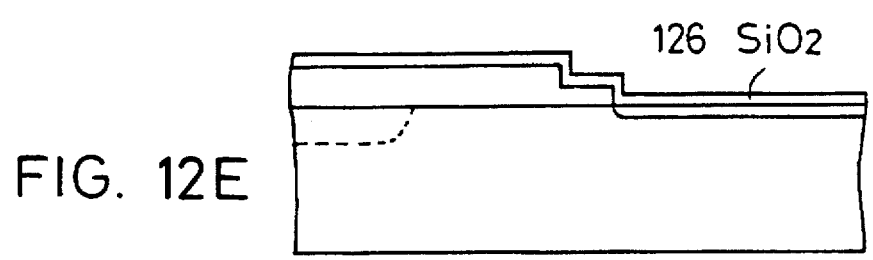

Subsequently, the introduction of diborane is stopped, and annealing is performed at 800° to 850° C. for approximately 30 minutes under a vacuum, or annealing is performed at 1050° to 1100° C. for 5 to 10 seconds by RTA, whereby activation of impurity atoms is performed simultaneously when a $p^+$ type impurity region 125 is formed (FIG. 12D).

Annealing is performed by a different device by extracting the semiconductor device from a device for the impurity introduction once.

The boron silicide layer remaining on the surface after the annealing process may be removed by the etching or oxide method, and when having done so, an $SiO_2$ layer 126 and the like has been formed by the CVD for the purpose of stabilization or protection of the $p^+$ type impurity region surface before proceeding to a subsequent process.

The boron silicide layer may be left in place for embodiments to be described below, and in this case, only a part of the boron silicide layer immediately above the contact portion with the $p^+$ type impurity region or the whole part may be selectively left.

Figure 9:
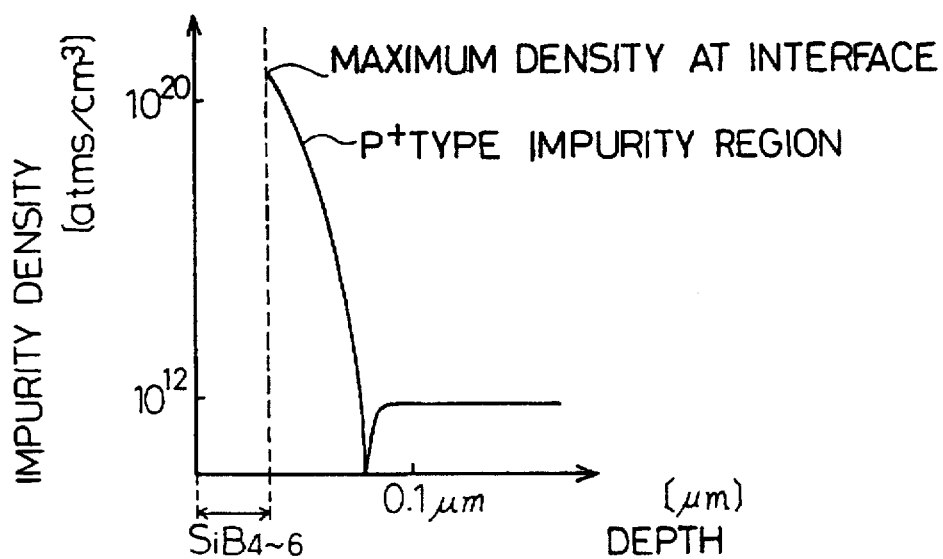
FIG. 9 is a diagram showing the impurity profile of a pin diode in a semiconductor device using a doping method in accordance with the present invention.

FIG. 9 is a graph showing an impurity profile of a pin diode in a semiconductor device using the doping method in accordance with the present invention.

Figure 10A:
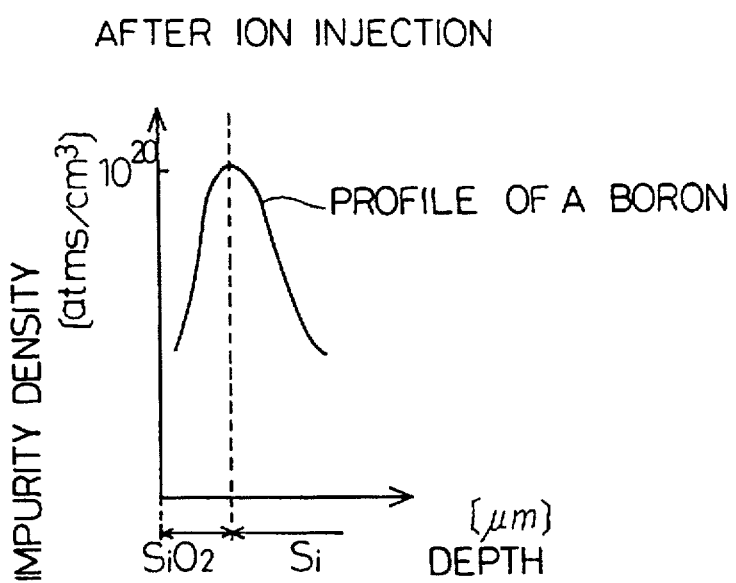
Figure 10B:
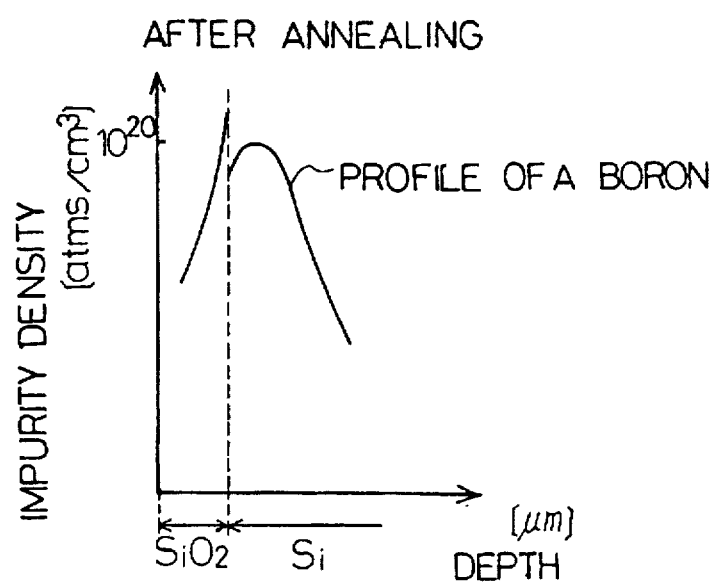

The impurity density is maximum at the surface of the semiconductor substrate, and therefore the $p^+$ type impurity region of a shallower depth Xj can be realized and also a structure having an insensitive layer whose thickness is reduced more in practice can be realized. FIGS. 10A and 10B are graphs showing an impurity profile of boron formed by ion injection. FIG. 10A is a graph of the profile after the ion injection whereas FIG. 10B is a graph of the profile after annealing. $SiO_2$ exists in the surface of the semiconductor substrate, and when having been annealed, the density of a portion in the vicinity of the surface is always lowered because of a difference in a coefficient of segregation of boron between Si and $SiO_2$ shown in FIG. 10B. The region from the peak point of the impurity profile to the surface is not only an insensitive region but also plays no role to restrain a leakage current because the density is lowered toward the surface. Therefore, the insensitive layer is made minimum in practice by application of the present invention, and the impurity profile of an ideal pin diode can be obtained.

Figure 7:
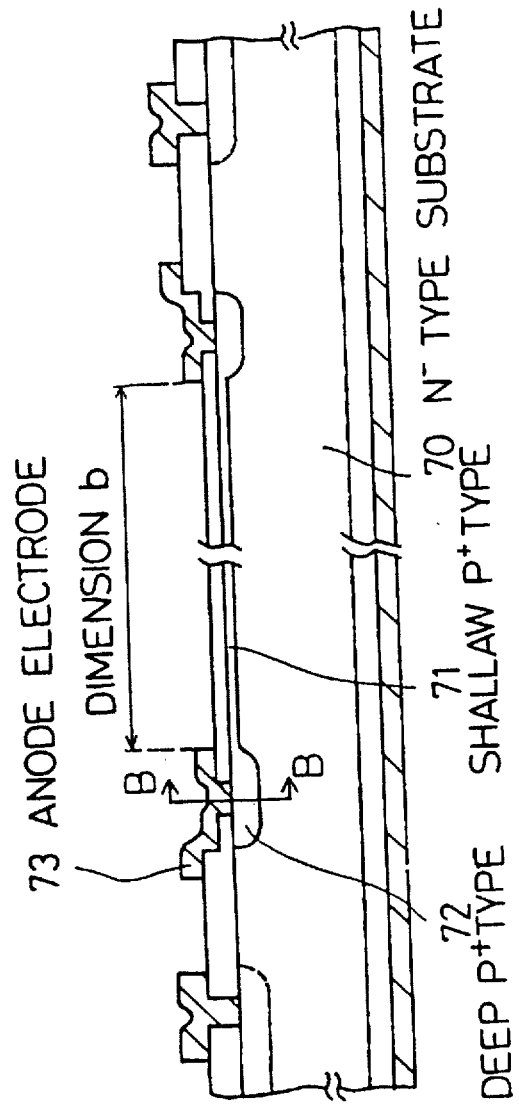
FIG. 7 is a schematic sectional diagram showing a pin diode in a semiconductor device in accordance with a second embodiment of the present invention.
Figure 8:
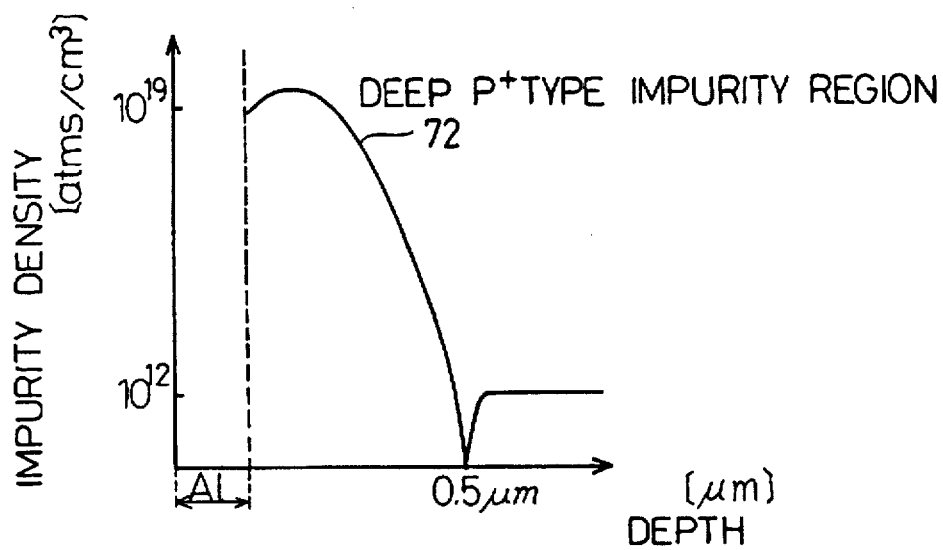
FIG. 8 is a diagram showing the impurity profile of the pin diode in the semiconductor device in accordance with the first embodiment of the present invention.

FIG. 7 is a schematic sectional view showing a pin diode in a semiconductor device in accordance with a second embodiment of the present invention. FIG. 8 is a graph showing an impurity profile of the pin diode in the semiconductor device in accordance with the second embodiment of the present invention, that is a profile in a section of an electrode take-out portion taken from the line B–B' of FIG. 7, in which the deep $p^+$ type impurity region 72 is constituted so as to have a depth Xj of approximately 0.5 μm.

It is general to use Al, Al-1% Si or the like for an anode electrode 73, and it is necessary to alloy a small amount of Al with Si by the heat treatment (approximately 400° to 600° C.) called sintering, alloying or the like in order to obtain a good ohmic contact (electrical contact) with the $p^+$ type impurity region.

In the $p^+$ type impurity region approximately 0.1 μm in thickness, if this alloy layer has a thickness of 0.2 μm, anode electrode Al 73 forms a short-circuit with the $n^-$ type substrate 70 under the anode electrode 73, thereby not functioning as a diode. Therefore, with the construction of the present invention, a light receiving portion of the shallow depth Xj ($p^+$ type impurity region) and a good electrode contact can be formed together. In the steps of a manufacturing process, it is necessary to form a deep $p^+$ type impurity region 72 prior to the formation of a shallow $p^+$ type impurity region 71.

Moreover, as described above, the present invention is more advantageous with respect to a leakage current and a breakdown voltage regulated by the radius R of curvature at an end portion of the impurity region.

Therefore, with the semiconductor device thus organized, it is effective when the dimension b is at least 10,000 times (1 mm or more) as long as the depth Xj, and the present invention is more effective when the ratio of the depth Xj to the length of one side of the $p^+$ type impurity region is 1:20,000 (2 mm or more).

Figure 11:
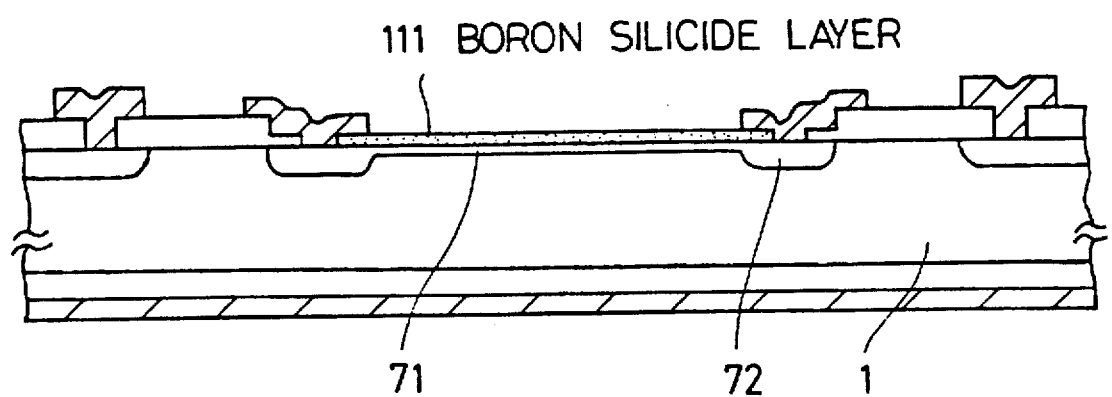
FIG. 11 is a schematic sectional view showing a pin diode in a semiconductor device in accordance with a third embodiment of the present invention.

FIG. 11 is a schematic sectional view showing a pin diode in a semiconductor device in accordance with a third embodiment of the present invention.

As described above, a boron silicide layer 111 is formed with a thickness of 200 to 1,000 Å by use of the doping method in a manufacturing method in accordance with the present invention. With such a construction, the presence of a boron layer having a density of 70% or more has neutrons, which have been incident, nuclear-reacted with boron to convert the neutrons into x-rays and Li nuclei, thereby enabling the detection of neutrons.

Figure 13:
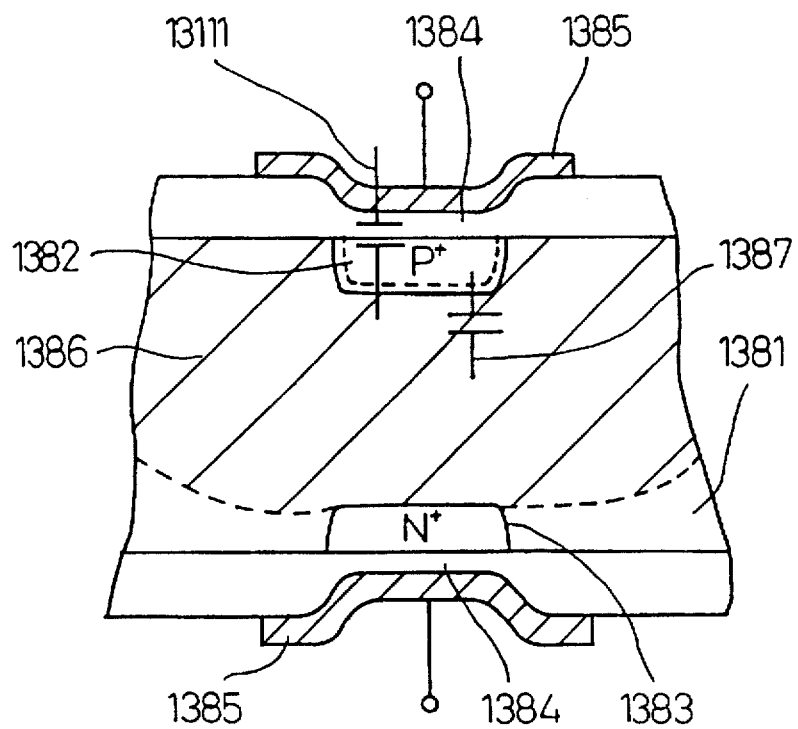
FIG. 13 is a schematic sectional view showing a semiconductor device in accordance with a fourth embodiment of the present invention.

FIG. 13 is a schematic sectional view showing a semiconductor device in accordance with a fourth embodiment of the present invention in which there are provided an n type semiconductor substrate 1381 which constitutes a first conductivity type semiconductor substrate and a $p^+$ type impurity region 1382 which constitutes a second conductivity type semiconductor substrate.

If a side (surface) on which the $p^+$ type impurity region 1382 exists is called a front surface, then there exists an $n^+$ type impurity region 1383 which is of n type having a density higher than that of the substrate on the rear surface in such a manner that a p-n junction consisting of $p^+$-$n^-$-$n^+$ is formed. This p-n junction acts as a light receiving region, that is a photosensor, and each pin diode has an electrode, that is a gate electrode 1385 made of Al over a gate insulation film 1384 which constitutes a capacitance forming insulation film made of $SiO_2$.

Figure 16:
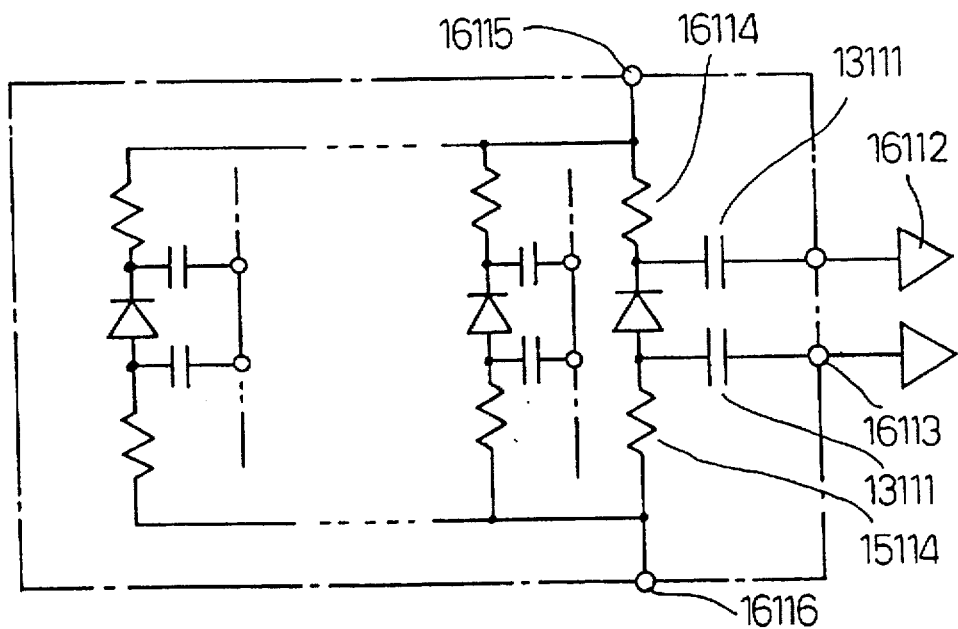
FIG. 16 is a block diagram showing a schematic circuit of a semiconductor device in accordance with the fourth embodiment.

FIG. 16 is a schematic diagram of a semiconductor device in accordance with the fourth embodiment of the present invention. An output is applied to an output terminal 16113 through a read capacitor's capacitance CG 13111 which is formed by the $p^+$ and $n^+$ type impurity regions and the gate electrode, and for example, coupled to an amplifier 16112 connected to the outside. The photodiodes of the $p^+$ and $n^+$ types are connected to respective anode 16116 and cathode 16115 through a voltage bias resistor 16114.

The voltage bias is used to form a depletion layer 1386 shown in FIG. 13, and its magnitude is determined by a signal to be detected (wavelength, energy) and an n semiconductor substrate 1381. A resistance 15114 is also determined by the combination of a signal to be read and a capacitor's capacitance 13111. However, the resistance of resistor 15114 is preferably set to a value as large as possible for detection of a very weak signal such as a charged particle.

Figure 14:
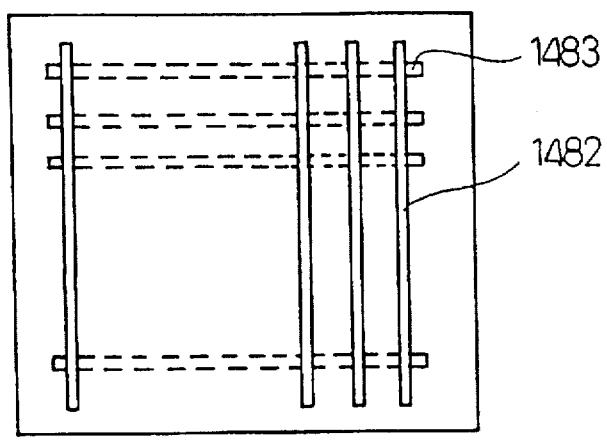
FIG. 14 is a schematic plan view showing the semiconductor device in accordance with the fourth embodiment of the present invention.

FIG. 14 is a schematic plan view showing a semiconductor device in accordance with the fourth embodiment.

A plurality of $p^+$ type impurity regions 1482 (1382) and a plurality of $n^+$ type impurity regions 1483 (1383) are arranged in the form of thin strips (hereinafter referred to as a "strip") so as to be transverse to each other, for example, at right angles or at a different angle. A bias resistor 16114 coupled to the respective $p^+$ and $n^+$ regions is commonly connected to an anode and cathode, and the number of the output terminals 16113 (pads) correspond to the number of the respective strips.

With such a construction, the semiconductor device can detect incident radiation or a signal produced by charge particles as two-dimensional information.

The $p^+$ type impurity region of the above-mentioned semiconductor device is produced by a method of the present invention, as a result of which the device is very effective in that the thickness of an insensitive layer is made as thin as possible, leakage current is reduced and the like.

Figure 15:
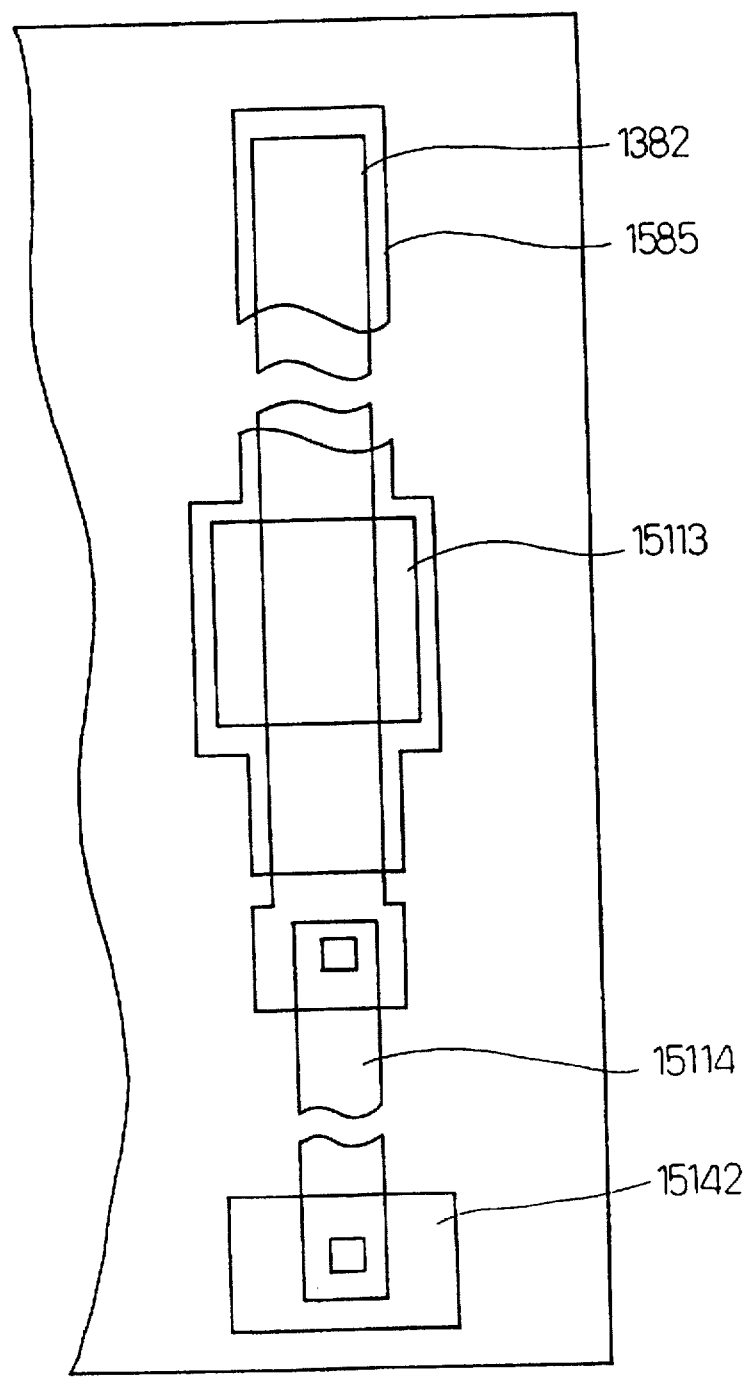
FIG. 15 is a schematic plan view showing one $p^+$ type impurity region strip consisting of a $p^+$ type impurity region 1382 and a gate electrode 1585 in accordance with the fourth embodiment of the present invention.

FIG. 15 is a schematic plan view showing one $p^+$ type impurity region strip which is formed by the $p^+$ type impurity region 1382 and the gate electrode 1585 in accordance with the fourth embodiment.

Figure 17:
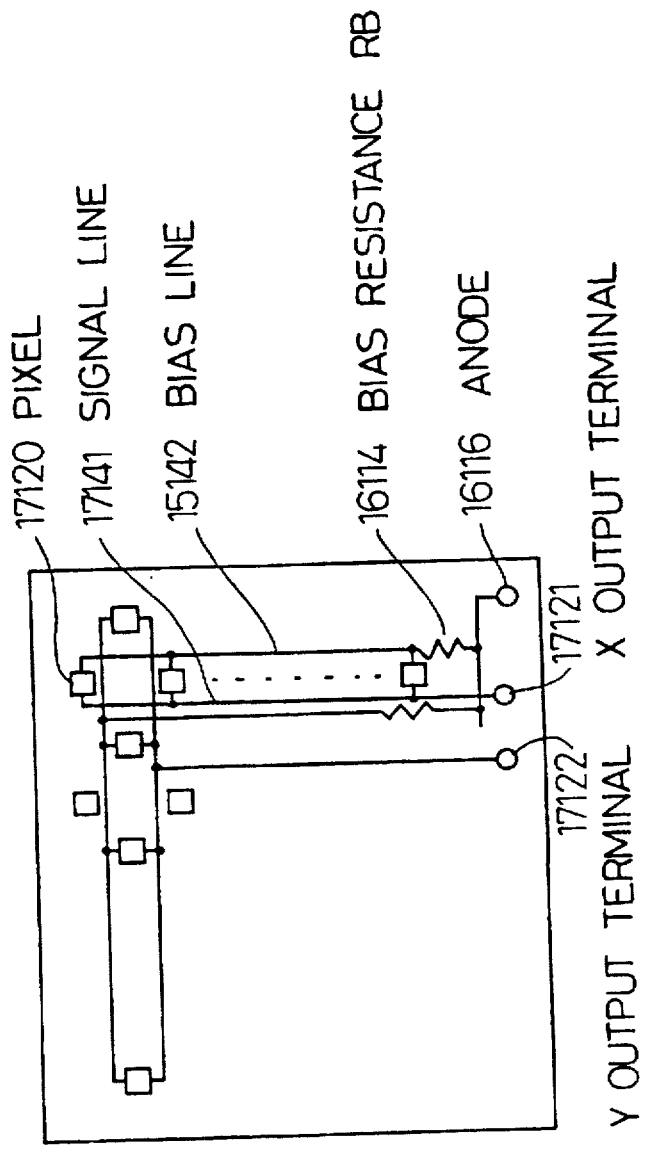
FIG. 17 is a schematic plan view showing the arrangement of a photosensor element in a semiconductor device in accordance with a fifth embodiment of the present invention.
Figure 18:
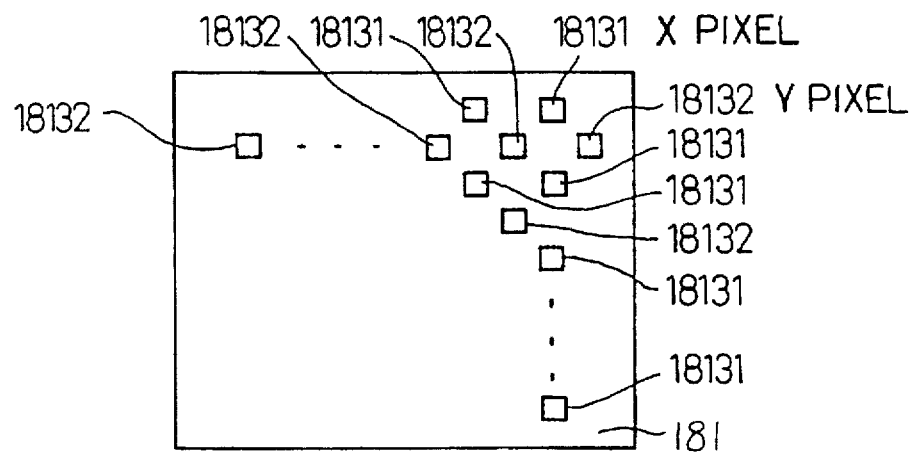
FIG. 18 is a schematic plan view showing the arrangement of a photosensor element in a semiconductor device in accordance with a fifth embodiment of the present invention.

FIGS. 17 and 18 are schematic plan views showing an arrangement of a photosensor element in a semiconductor device in accordance with a fifth embodiment of the present invention, and as shown, the shape of a photosensor is constituted in the form of a short region (hereinafter referred to as a "pixel") instead of a strip, and the photosensors are arranged on the surface of a single semiconductor.

The pixels are arranged alternately, and the pixels to be read as information of tare -coordinates are disposed as X pixels 18131 whereas the pixels to be read as information of the Y-coordinates are disposed as Y pixels 18131.

Figure 19:
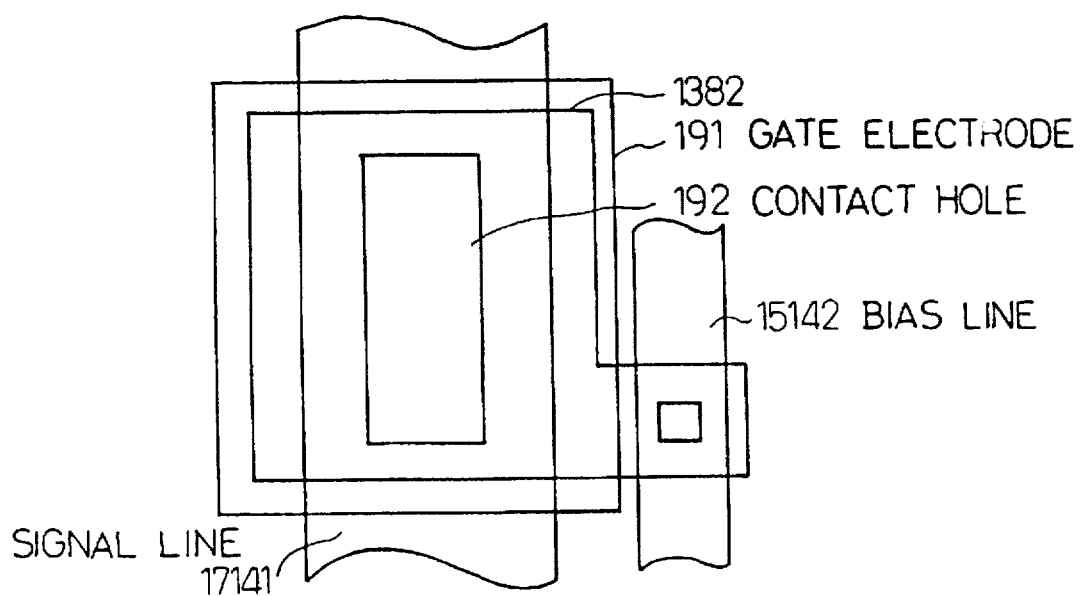
FIG. 19 is a schematic plan view showing a pixel in a semiconductor image sensor in accordance with this embodiment of the present invention.

FIG. 19 is a schematic plan view showing a pixel in accordance with this embodiment, and it may be fundamentally considered that the strip used in the fourth embodiment of the present invention is made shorter. However, the conventional strip structure makes it difficult that this embodiment is realized.

That is, this is because the semiconductor device of this embodiment requires a metal wiring of at least two layers (hereinafter referred to as a "metal") other than a gate electrode of at least one layer.

Figure 20:
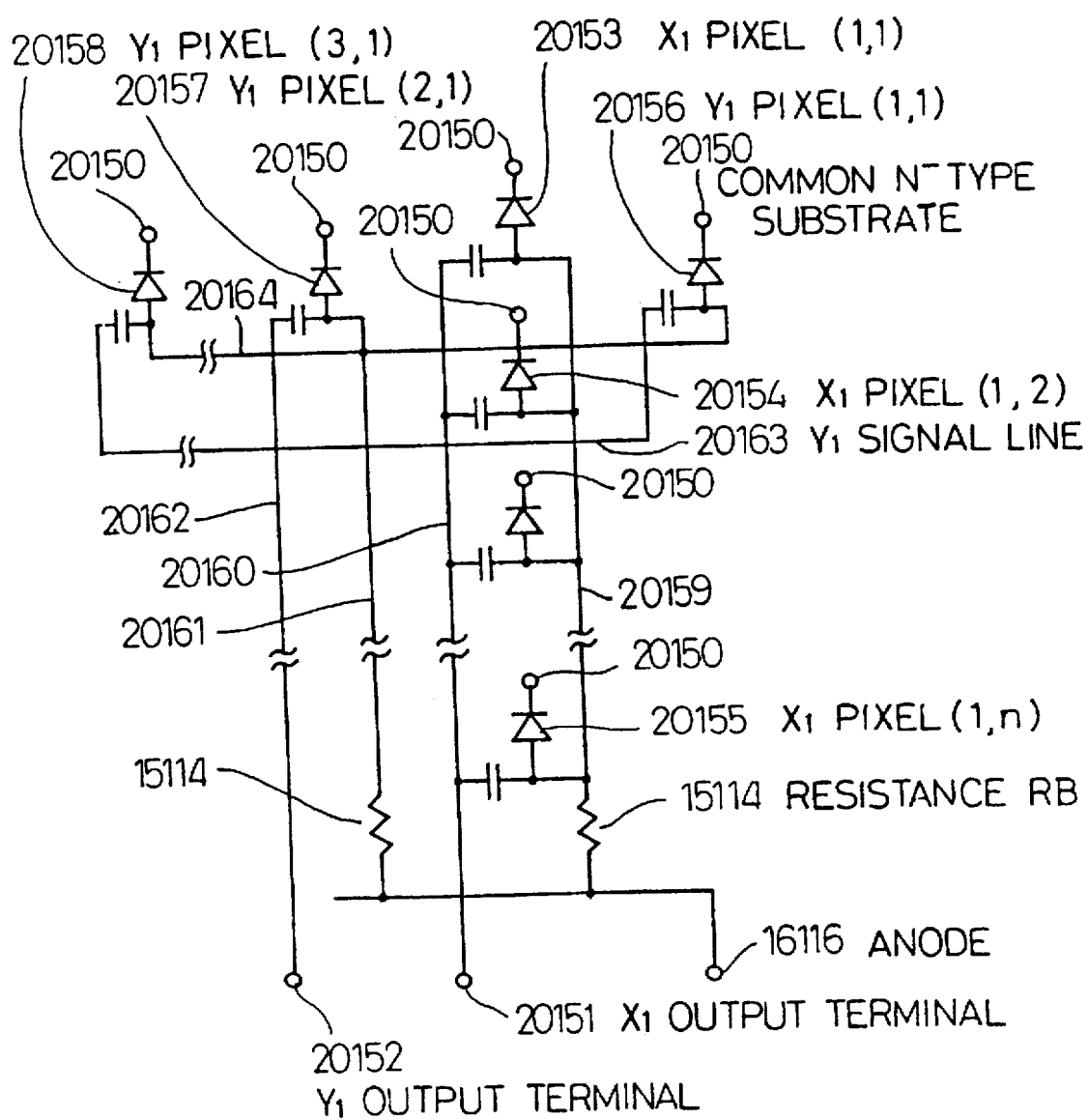
FIG. 20 is a schematic block diagram showing the circuit of a semiconductor device in accordance with the fifth embodiment of the present invention.

FIG. 20 is a schematic block diagram showing a circuit of the semiconductor device in accordance with the fifth embodiment of the present invention. In the figure, the respective outputs of a plurality of X1 pixels (1, 1) 20153 to (1, n) 20155 arranged in the Y-axial direction are connected with an X1 signal line 20160 and led to an X1 output terminal 20151, and also a bias line for applying a bias voltage to the respective ones is connected with an X1 bias line 20159 and led to an anode 16116 through a resistor 15114.

A plurality of Y1 pixels arranged in the X-axial direction are also disposed in the same manner. With such a construction, a plurality of X1 pixels and Y1 pixels are arranged two-dimensionally thereby to obtain two-dimensional information.

For example, an X1 bias line 20159, an X1 signal line 20160, a Y1 bias longitudinal line 20161, and a Y1 signal longitudinal line 20162 are constituted by metal wires of a first layer, and a Y1 bias lateral line 20164 and a Y1 signal lateral line 20163 are constituted by metal wires of a second layer in such a manner that all terminals of X, Y outputs, an anode and the like can be disposed in one direction.

The semiconductor device of this embodiment can obtain two-dimensional information with only one surface in the above manner. The p$^+$ type impurity region of the above-mentioned semiconductor device is formed by a method of the present invention, and this is very effective in reduction of leakage current by making the thickness of an insensitive layer as thin as possible.

Figure 21A:
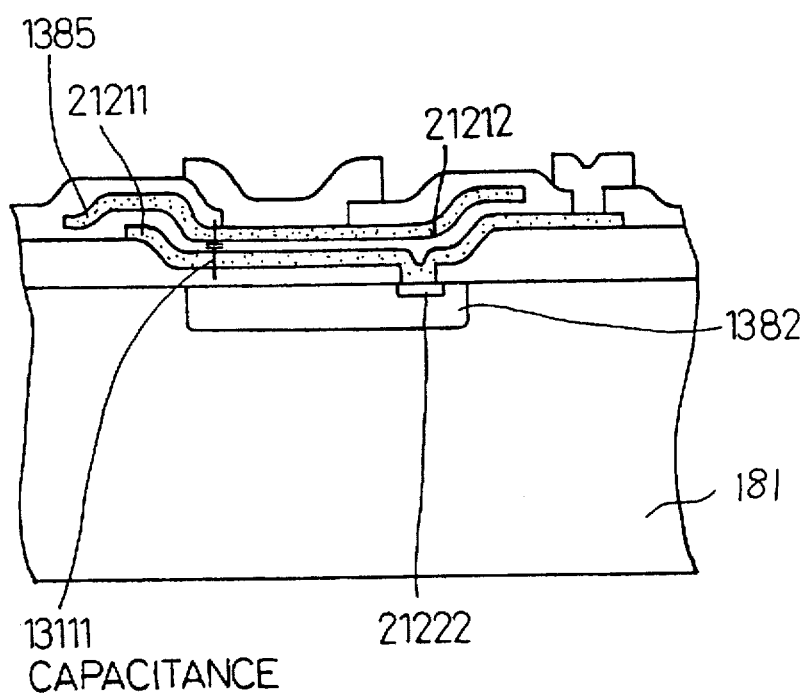

FIG. 21A is a schematic sectional view showing a pixel structure in a semiconductor device in an example to which the fifth embodiment of the present invention is applied.

A first poly Si region forms an n type emitter region 21222 which constitutes an inverse conductive type impurity region through an emitter opening 21212 and simultaneously forms an emitter electrode 21211 by itself so as to provide a so-called poly Si emitter structure, as a result of which an emitter region as minute as possible can be formed thereby to reduce the capacitance between a base and an emitter as much as possible.

A large capacitance between the base and the emitter has the adverse effect that response speed is delayed. A capacitance 13111 is formed between emitter electrode 21211 and a poly Si gate electrode 1385 of a second layer.

It goes without saying that the area of the p$^+$ type impurity region 1382 can be reduced as occasion demands, as in the fourth embodiment.

Figure 21B:
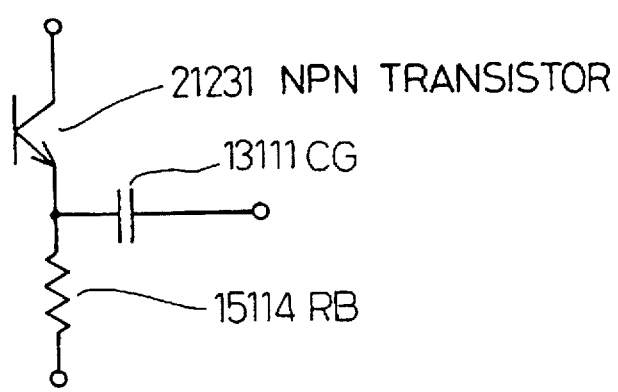

FIG. 21B is a schematic circuit diagram showing a pixel in an example to which the fifth embodiment is applied.

As shown in the figure, an npn transistor 21231 of a bipolar type is formed to obtain a gain higher than a p-n junction. The effect can be obtained even though the npn structure of this embodiment is applied to all the strip type photosensors in the above-mentioned embodiments.

Similarly, formation of the p$^+$ type impurity region corresponding to a base of such a semiconductor device by a method of the present invention is very effective in reduction of leakage current by making the thickness of the insensitive layer as thin as possible.

It is similarly effective to provide a p$^+$ type impurity region having a little deeper depth Xj under an emitter region as in the second embodiment.

Figure 22:
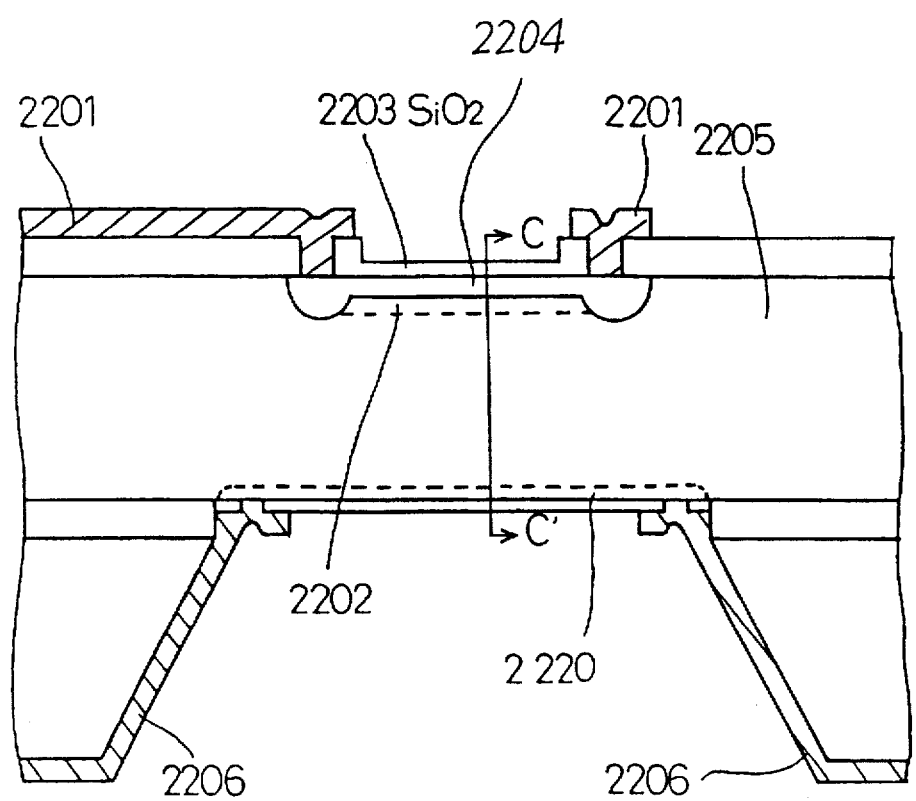
FIG. 22 is a schematic sectional view showing an avalanche photodiode in a semiconductor device in accordance with a sixth embodiment of the present invention.
Figure 23:
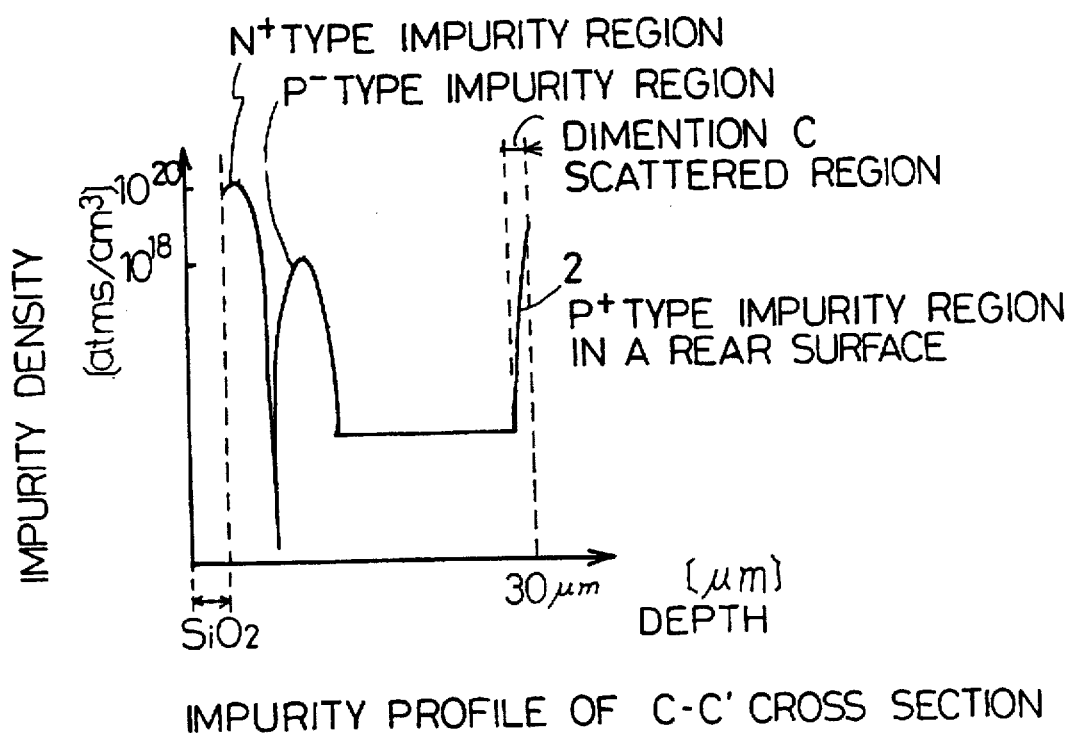
FIG. 23 is a diagram showing an impurity profile in accordance with the sixth embodiment of the present invention.
Figure 24:
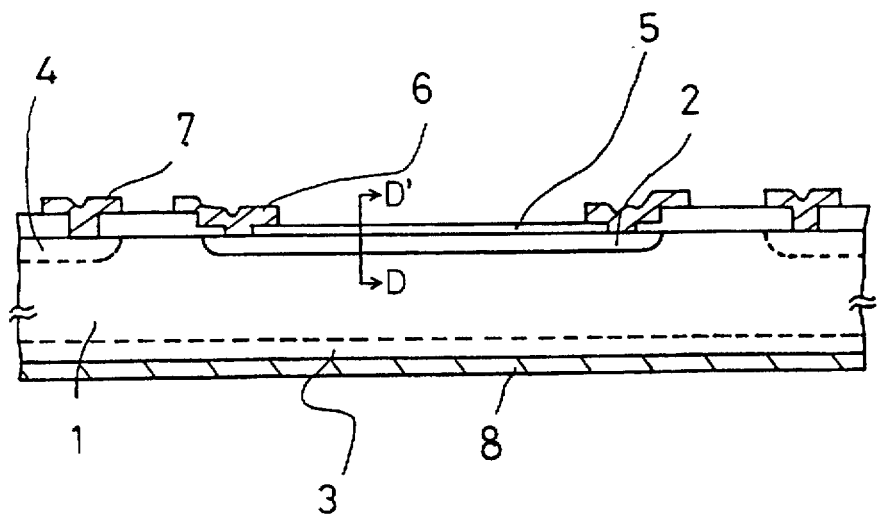
FIG. 24 is a schematic sectional view showing a conventional semiconductor device.
Figure 25A:
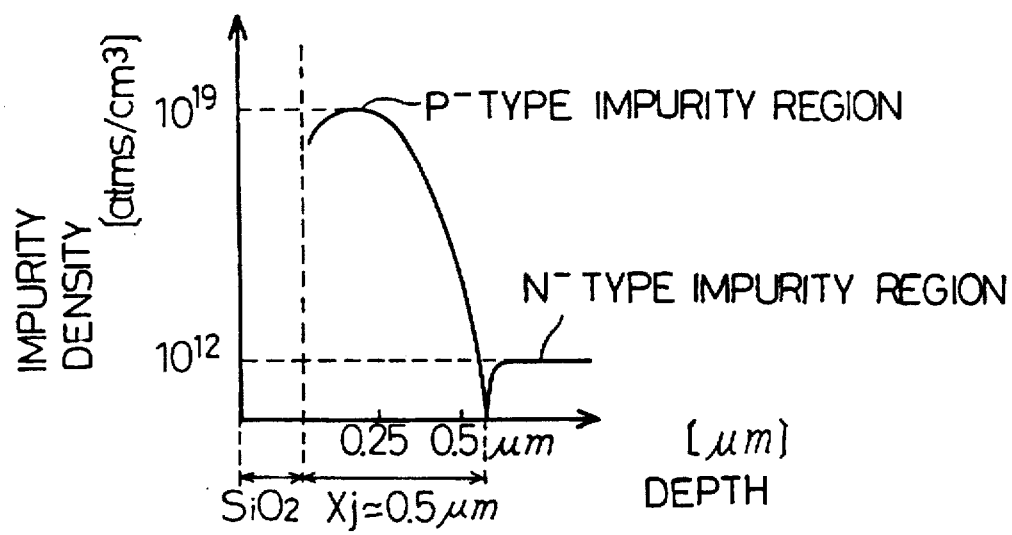
Figure 25B:
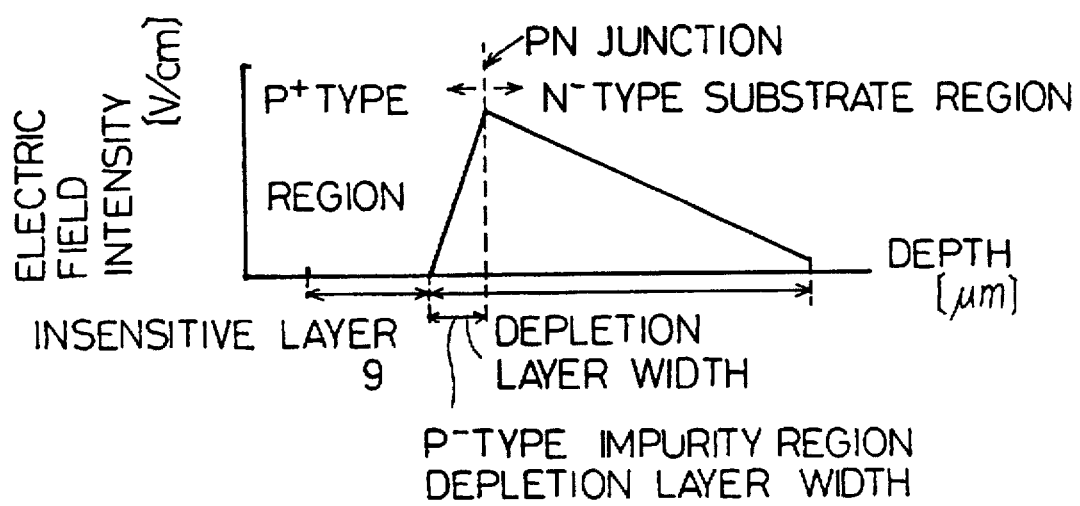

FIG. 22 is a schematic sectional view showing an avalanche photodiode in a semiconductor in accordance with a sixth embodiment of the present invention. FIG. 23 is a graph showing an impurity profile in the semiconductor device in accordance with the sixth embodiment of the present invention.

In the case of detecting x-rays and the like, a p$^+$ type impurity region 2220 on a surface at a side opposite to where an n$^+$ type impurity region 2204 is formed, that is at a rear surface, constitutes a scattered region of incident radiation, and it is preferable that its dimension c is made as small as possible. For example, even though the scattered region is ground from the rear surface side into a thin one, the resultant length becomes as long as several μm as far as an epitaxial substrate is used.

As shown in FIG. 22, p$^+$ type impurity region 2220 in the rear surface is constituted according to the present invention so that a time resolution (a peak half value width on a time spectrum) of several tens of decimals or less can be obtained.

In a seventh embodiment of the present invention, an Si semiconductor substrate of a face orientation (100) having a resistivity of 100 Ωcm or more is used as a n$^-$ type semiconductor substrate 1 in a pin diode shown by a schematic sectional view of FIG. 1.

A manufacturing method will be described below.

An oxide film is formed on the surface of an Si semiconductor substrate by heat oxidation under a steam atmosphere. Subsequently, a predetermined portion of oxide film is removed to form n$^+$ type impurity region 4 and n$^+$ type impurity region 3 in a rear surface.

The formation of the n$^+$ type impurity region is made by a p type heat diffusion method, that is by deposition of POCL$_3$, and subsequently annealing (drive in) at 900° to 1000° C. under an oxidizing atmosphere.

Thereafter, p$^+$ type impurity region 2 is formed on a predetermined portion by ion injection with the steps stated below.

After an oxide film is removed, a thin SiO$_2$ layer of 150 to 250 Å is formed by oxidation in oxygen, and then BF$_2$ or B is ion-injected at 30 to 150 KeV by 1×10$^{14}$ to 5×10$^{15}$ atoms/cm$^2$. Subsequently, annealing is performed at 700° to 1,050° C. in an N$_2$ atmosphere. With the above-mentioned process, the p$^+$ type impurity region is formed.

SiO$_2$ film 5 right above the p$^+$ type impurity region 2 has a thickness which reduces reflection as much as possible. That is, the film 5 acts also as a reflection preventing film.

This oxide film is formed by the chemical gas-phase growth method using SiH$_4$ and N$_2$O. Thereafter, a contact hole is formed, sputtering of Al-1% Si is performed, and patterning is performed. Consequently, an anode electrode 6 and a cathode electrode 7 are formed by alloying.

In this manner, the pin diode of 1×1 cm is manufactured, and its spectral characteristics were measured.

Figure 26:
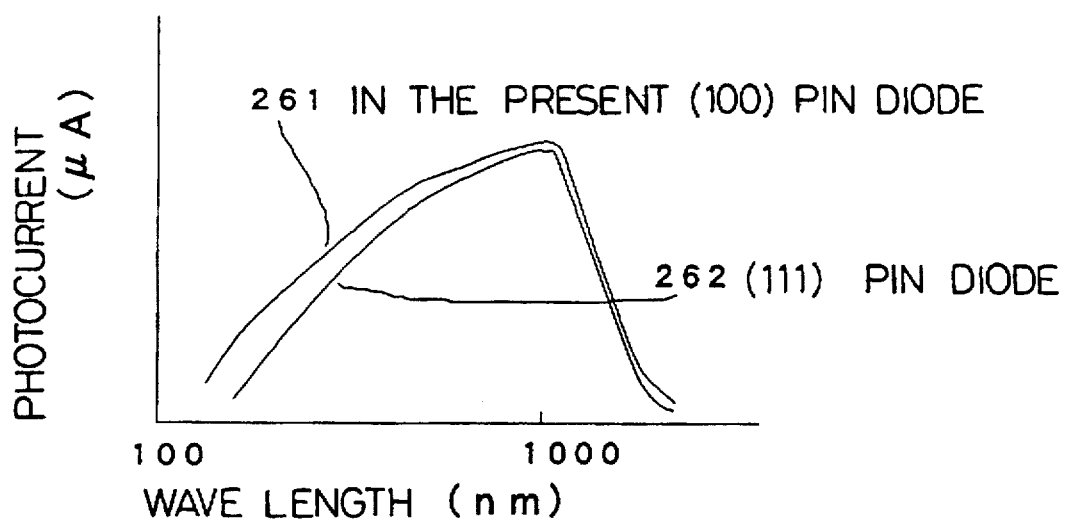
FIG. 26 is a diagram showing the wavelength-photoelectric characteristics of a pin diode.

At this time, the wavelength-photoelectric characteristic is represented by a curve 261 in FIG. 26.

A dark current was 2 nA or less at 25° C.

The wavelength-photoelectric characteristics of the pin diode have entirely the same conditions as mentioned above except that a semiconductor substrate constituted by an Si semiconductor substrate of a face orientation (111) is represented by a curve 262 shown in FIG. 26.

It has been found that the pin diode using an Si semiconductor substrate of the face orientation (100) in accordance with the present invention has an excellent sensitivity in the shorter wavelength region.

It has been found that it is difficult to form a shallow junction of B because B has a small atomic number and is liable to diffuse, and therefore the shorter wavelength light is absorbed in the p$^+$ type impurity region so that an improvement of the shorter wavelength sensitivity becomes difficult. However, the present invention is effective even in this case and in particular useful for the n type substrate.

When the resistivity is 100 Ωcm or less, the spreading of a depletion layer is made small, the junction capacitance is made large, and a high reverse bias voltage is required, as a result of which the dark current is increased and the sensitivity and response speed are lowered. Consequently, the resistivity is preferably 100 Ωcm or more.

Upon having observed the spreading of a depletion layer, the depletion layer was saturated at the reverse bias voltage of 90 V in the case where an n type Si semiconductor substrate of the face orientation (100) and 1KΩ.cm resistivity has a thickness of 200 μm. The depletion layer was saturated at the reverse bias voltage of 65 V in the n type Si semiconductor substrate of the face orientation (100), 3 kΩ.cm, and a thickness of 300 μm.

On the other hand, in the n type Si semiconductor substrate of the face orientation (111), 3KΩ.cm and a thickness of 300 μm, there were some depletion layers which were saturated at the reverse bias voltage of 90 V; however, there were a lot of depletion layers which were not saturated even at the reverse bias voltage of 100 V.

It is preferable that the thickness of a detector is thick in the high energy (e.g. the x-ray) physical/space physical fields. In particular, it is preferable that the depletion layer is saturated at a thickness of 200 μm or more, and in this case, particularly, it is preferable to set the resistivity of the substrate to 1 kΩ.cm or more.

In such a high-resistivity substrate, control of the electrical characteristics becomes difficult. However, they are advantages in that the electrical characteristics become stable by use of the n type substrate, and the depletion layer is saturated at a low reverse bias voltage so that a pin diode of a low junction capacity and a low voltage operation can be obtained.

A method of forming a p$^+$ type impurity region in a pin diode may be changed for manufacturing. That is, in the formation of the p$^+$ type impurity region, an oxide film on a predetermined portion is removed as much as possible to have an active clean surface exposed, and thereafter a boron silicide film is formed by the chemical gas-phase growth method. Finally, a p$^+$ type impurity region is formed by heat diffusion. Even in this case, the same effect can be obtained.

In an eighth embodiment of the present invention, an Si semiconductor substrate of a face orientation (100) is used as an n$^-$ type semiconductor substrate 1 in a pin diode shown by a schematic sectional view of FIG. 11.

In this case, when neutrons are incident, α-rays are produced and therefore a high sensitivity detection of neutrons can be performed.

In a ninth embodiment of the present invention, an Si semiconductor substrate of a face orientation (100) is used as an n type semiconductor substrate 1381 in a semiconductor device shown by a schematic sectional view of FIG. 13 and a schematic plan view of FIG. 14. With such a construction, incident light, radiation, or particle signals can be obtained as two-dimensional information with a high sensitivity.

In a tenth embodiment of the present invention, an Si semiconductor substrate of a face orientation (100) is used as an n type semiconductor substrate 181 in a semiconductor device shown by a schematic plan view of FIG. 18 and schematic sectional view of FIG. 21. In this manner, two-dimensional information with a high sensitivity can be obtained at one surface of the semiconductor device.

In an eleventh embodiment of the present invention, an Si semiconductor substrate of a face orientation (100) is used as a p$^-$ semiconductor substrate 371 of a conventional avalanche photodiode. Even in this case, the sensitivity is improved by use of the Si semiconductor substrate of the face orientation (100).

Figure 27:
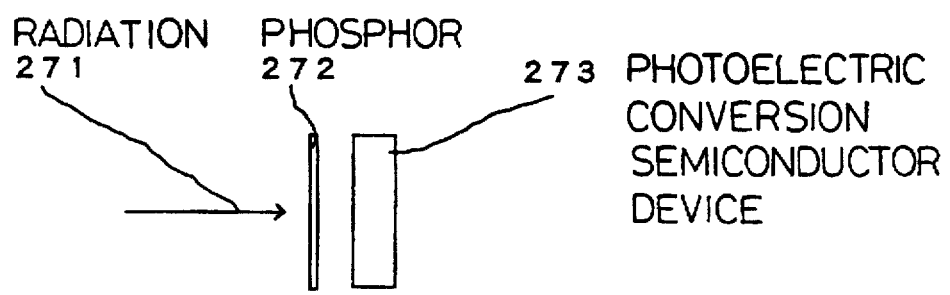
FIG. 27 is a general diagram showing a radiation detector in accordance with a twelfth embodiment of the present invention.

FIG. 27 is a conceptual diagram showing a radiation detector in a semiconductor device in accordance with a twelfth embodiment of the present invention.

A phosphor 272 is disposed between a source of radiation 271 and a photoelectric conversion semiconductor device 273 to convert radiation into light for detection. The phosphor 272 may be directly formed on the surface of a semiconductor substrate in the photoelectric conversion semiconductor device, or a light guide may be disposed between the phosphor 272 and the photoelectric conversion semiconductor device.

For detection of x-rays, γ rays, β rays, α rays, electron rays, ultraviolet rays, and other particle rays, there are used a phosphor, or a scintillator, and the light luminance fluorescence of the phosphor converts the rays into light for detection. Many phosphors and scintillators emit light at a shorter wavelength, and in this case, the photoelectric conversion semiconductor device using the Si semiconductor substrate of a face orientation (100) in accordance with the present invention is effective in detection of the converted light.

Figure 28:
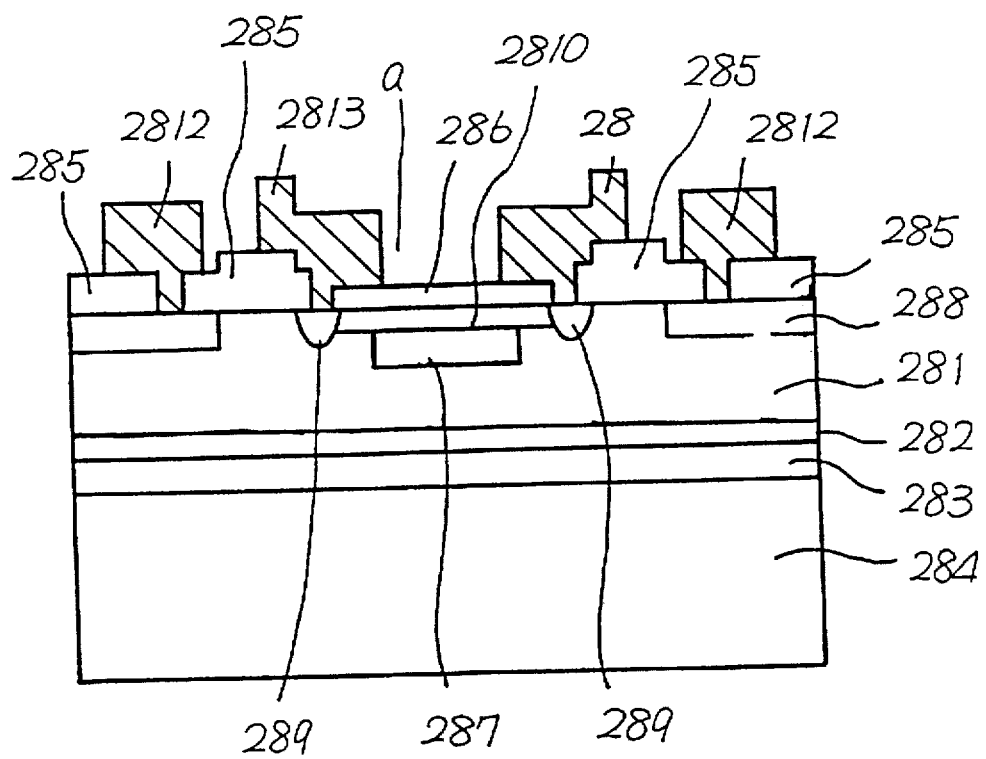
FIG. 28 is a schematic sectional diagram showing an avalanche photodiode in accordance with a thirteenth embodiment of the present invention.

FIG. 28 is a schematic sectional view showing an avalanche photodiode in accordance with a thirteenth embodiment of the present invention.

For example, an insulation film 283 made of SiO$_2$ is formed between a support substrate 284 made of silicon and an FZ substrate 281 made of a p$^-$ type silicon with a resistivity of 50 Ω.cm or more by heat oxidation or CVD.

On the surface of the FZ substrate 281 opposite to the support substrate 284, there are formed an n$^+$ type impurity region 2810 doped with, for example, As or P, an n$^+$ type impurity region 289 doped with P, which has a great thickness and is brought in contact with and surrounds the impurity region 2810, and a p$^+$ type impurity region 288 doped with, for example, B, which is apart from and surrounds the impurity region 289.

A p type impurity region 287 doped with, for example, B, is brought in contact with the lower portion of the n$^+$ type impurity region 2810.

An oxide film 285 and an oxide film 286 made of SiO$_2$ film are formed on the upper surface of the FZ substrate 281 by heat oxidation.

A p$^+$ type impurity region 282 on a rear surface which has been doped with, for example, boron is formed on the front surface of the FZ substrate 281 on the side of the support substrate 284.

An anode electrode 2812, which forms an electrode of the p$^+$ type impurity region 288, and a cathode electrode 2813, which forms an electrode of the deep n$^+$ impurity region 289 or the n$^+$ type impurity region 2810, are formed in and on the oxide film 285.

Support substrate 284 has a role of reinforcing and supporting the FZ substrate during a manufacturing process, and is preferably made of a silicon substrate equal in heat expansion coefficient to the FZ substrate, and when considering a high-temperature heat treatment process in a high-temperature semiconductor manufacturing process, it is most preferable to use a silicon CZ substrate which is strong in the heat treatment, and it is required that its thickness is at least 100 μm, and preferably 200 μm or more.

With a construction of this embodiment, it is possible to set the resistivity of the FZ substrate to several kΩ.cm or more which cannot be obtained by an epitaxial layer.

Moreover, in the case where an epitaxial substrate is used, the p$^+$ type impurity region 282 on a rear surface, whose thickness cannot be made less than several μm even when grinding the region 282, can be easily formed less than 1 μm in the structure of this embodiment, and if doing so, the time resolution of the avalanche photodiode can be improved.

In the case where the thickness of the FZ substrate of the usual avalanche photodiode without the structure of this embodiment is 100 μm or less, cracking of the substrate and dislocation slip are increased during a heat treatment and other manufacturing processes, as a result of which there are shortcomings involving lowering of the device performance such as decrease of the manufacturing yield, increase of the reverse bias leakage current and the like.

When the thickness of the FZ substrate is 10 μm or less, the detection efficiency of x-rays is not practical, and the present invention has a large effect when the FZ substrate has a thickness of 10 to 100 μm.

Figure 29:
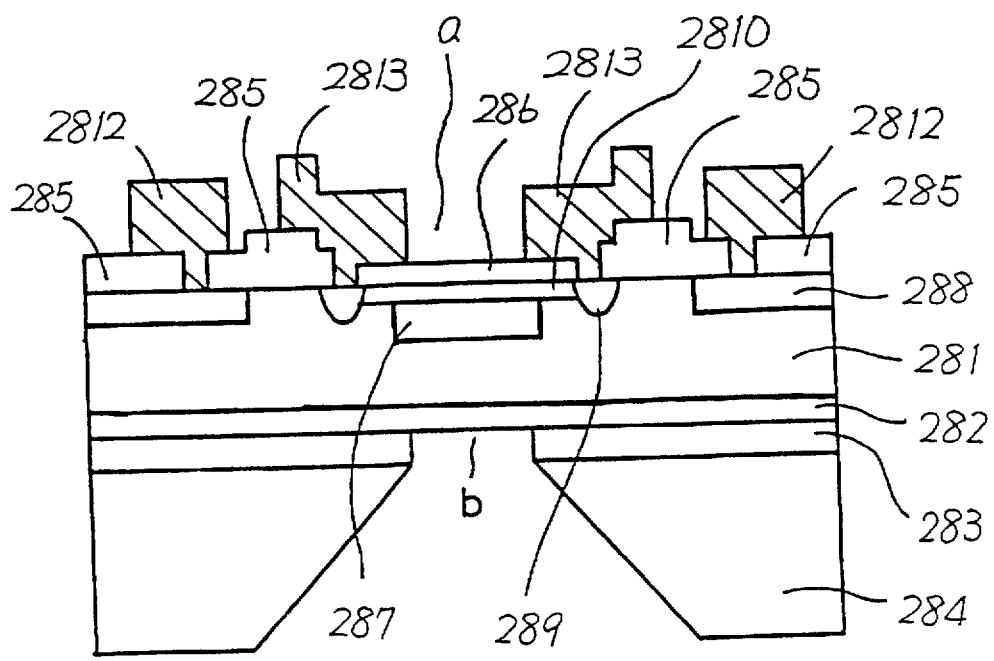
FIG. 29 is a schematic sectional diagram showing an avalanche photodiode in accordance with a fourteenth embodiment of the present invention.

FIG. 29 is a schematic sectional view showing an avalanche photodiode in accordance with a fourteenth embodiment of the present invention. In this embodiment, a part of the support substrate 284 in the first embodiment is removed to provide a substrate opening b. The substrate opening b is defined in at least a part of portions right under the p-n junction at a portion where the $n^+$ type impurity region 2810 is brought in contact with the p type impurity region 287 in the FZ substrate 28. In the opening b, an insulation film 283 is also removed. Other construction is the same as that in the first embodiment.

In the case where radiation or the like is incident at the opening b, or the avalanche photodiodes of the present invention are laminated for detection of x-rays, it is preferable to remove insulation film 283 as shown in FIG. 29. However, in the case where visible light or the like is incident from the opening b, the insulation film 283 may exist if $SiO_2$ is 150 nm or less. Moreover, in the case where electron radiation, light or the like is incident from the opening b, it is preferable that the opening b is made smaller than the p type impurity region 287 which forms an amplifying region, because the dispersion of the amplification factor due to the incident position is reduced.

When radiation or the like is incident from the side of the $n^+$ type impurity region 2810, if the depth of penetration of the incident radiation or the like toward Si approaches the p type impurity region 287 which forms an amplifying region, the amplification factor is dispersed or lowered. However, if the radiation or the like is incident from the opening b with the avalanche photodiode in accordance with this embodiment, such a problem does not occur. Therefore, in the thirteenth embodiment, in the case where the radiation or the like is incident from the opening b, better characteristics are obtained, and the significance of making the detection efficiency improved by forming the p type impurity region 287 having its thickness of 1 μm or less is large.

In the fourteenth embodiment, if the support substrate 284 is formed by a silicon substrate of a face orientation (100), a wall portion having a <111> orientation from which the FZ substrate 281 has been removed and the opening b are transverse to each other at an obtuse angle due to anisotropic etching using KOH or the like. For that reason, the concentration of a large stress at an edge portion of the opening b is relieved so that the mechanical strength can relatively be increased.

Figure 50:
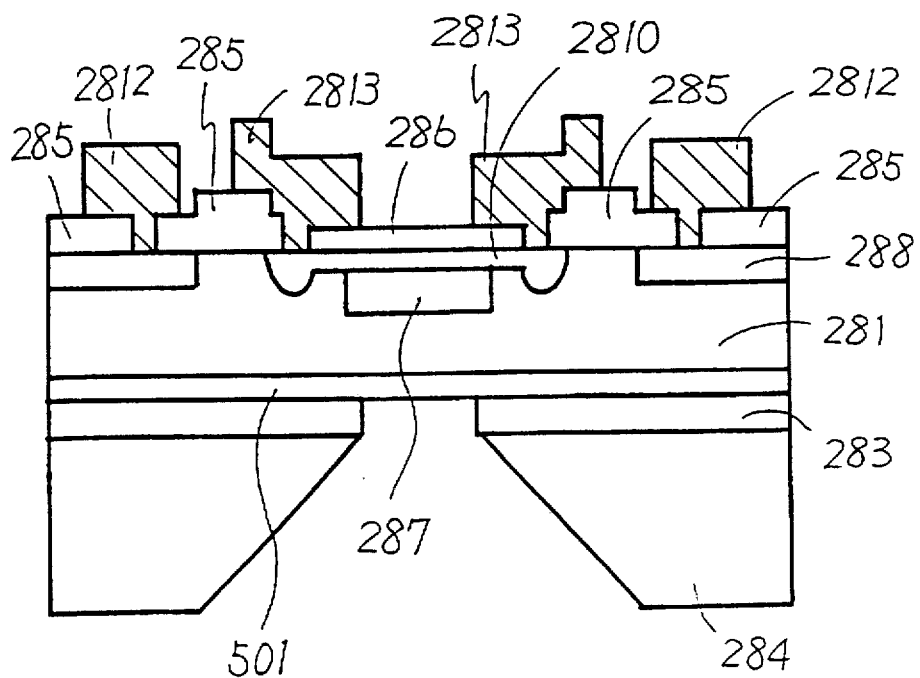
FIG. 50 is a schematic sectional view showing an avalanche photodiode in accordance with a fifteenth embodiment of the present invention.

FIG. 50 is a schematic sectional view showing an avalanche photodiode in accordance with a fifteenth embodiment of present invention. Semi-Insulating Polycrystalline Silicon layer (SIPOS) 501 is formed instead of a $p^+$ type impurity region in a rear surface.

The interface between SIPOS layer 501 and $p^-$ semiconductor substrate 281 has a negative electron charge and storage holes and it has the same effect as a shallow $p^-$ impurity region.

A SIPOS is oxygen doped poly silicon formed by CVD with $N_2O$ and $SiH_4$, in a temperature range from 600° C. to 700° C. It is preferable to perform a heat treatment from 900° C. to 1000° C. after forming a SIPOS. Plasma CVD is able to form the SIPOS about 300° C. and able to change its resistivity and conductive type by doping with oxygen, B or P. The Plasma CVD is preferred for controlling electrical properties than impurity region forming methods employing thermal diffusion.

A SIPOS can be made thinner than a layer formed by CVD. The region which has the same effect as forming a $p^+$ type impurity region and which forms the interface between SIPOS layer 501 and $p^-$ semiconductor substrate 281, is very thin. Then such Semi-Insulating Polycrystalline is able to increase transmittance better than a $p^+$ type impurity region.

Figure 30:
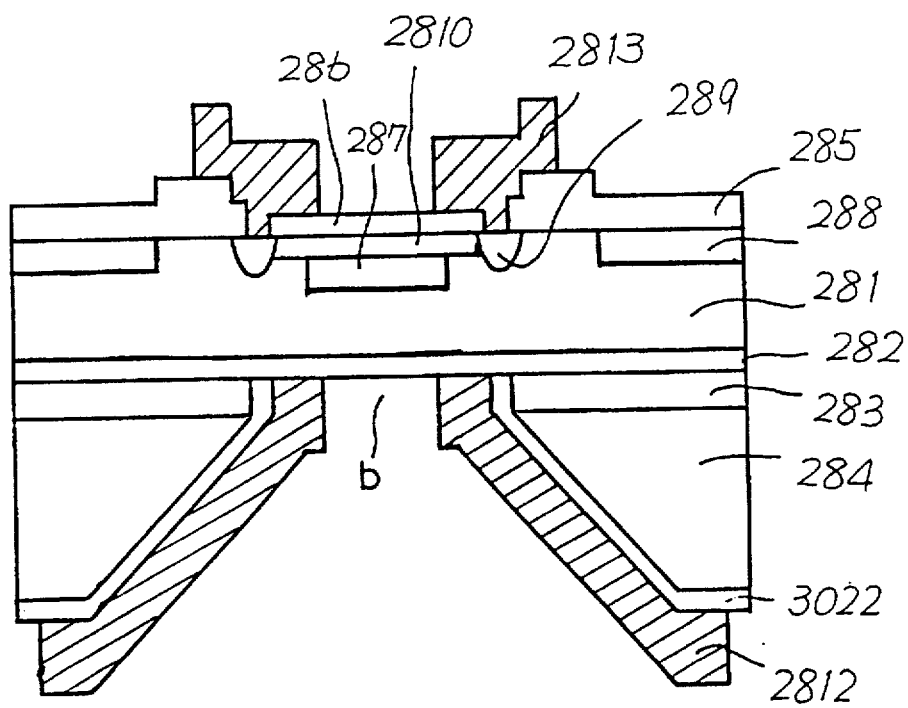
FIG. 30 is a schematic sectional diagram showing an avalanche photodiode in accordance with a sixteenth embodiment of the present invention.

FIG. 30 is a schematic sectional view showing an avalanche photodiode in accordance with a sixteenth embodiment of the present invention. In this embodiment, the anode electrode 2812 which has been brought in contact with the $p^+$ type impurity region 288 in the fourteenth embodiment is formed so as to be brought into contact with a $p^+$ type impurity region 282 on a rear surface of the FZ substrate 281 on the side of the support substrate 284. Moreover, an insulation film 3022 made of, for example, $SiO_2$ is formed between the anode electrode 2812 and the substrate 284.

In the case where electron radiation, light or the like is incident at the opening b, in the same manner as described in the fourteenth embodiment, it is preferable that the opening b is made smaller than the p type impurity region 287 which forms an amplifying region, because the dispersion of the amplification factor due to the incident position is reduced. In this embodiment, the size and configuration of the opening b can be determined by the anode electrode 2812 having its thickness which is approximately 1/100 times as great as that of the substrate 284 having its thickness of 100 μm or more. Consequently, the avalanche photodiode of the present invention can be manufactured so that the accuracy in the configuration is increased and the dimensions are reduced. Other construction is the same as that in the thirteenth embodiment.

With the construction of this embodiment, since a serial resistance between the electrodes can be reduced, an avalanche photodiode with a better signal time resolution can be obtained.

Figure 31:
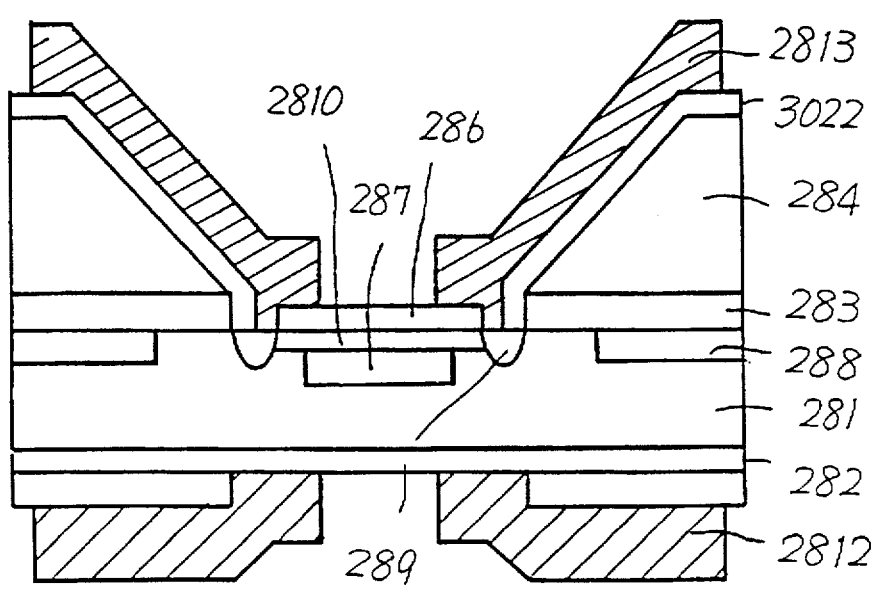
FIG. 31 is a schematic sectional diagram showing an avalanche photodiode in accordance with a seventeenth embodiment of the present invention.

FIG. 31 is a schematic sectional view showing an avalanche photodiode in accordance with a seventeenth embodiment of the present invention. An insulation film 283 is formed between a support substrate 284 and an Fz substrate 281. On the surface of the FZ substrate 281 on the side of the support substrate 284, there are formed an $n^+$ type impurity region 2810 which has been doped with, for example, As or P, a deep $n^+$ type impurity region 289 which has been doped with, for example, P, and is brought in contact with and surrounds the region 2810, a cathode electrode 2813 which forms an electrode of the deep $n^+$ type impurity region 289 or the $n^+$ type impurity region 2810, and a $p^+$ type impurity region 288 which has been doped with, for example, boron, and is not brought in contact with, but surrounds, the deep $n^+$ type impurity region 289. A p type impurity region 287 which has been doped with, for example, boron is formed in such a manner that it is brought in contact with a lower portion of the n⁺ type impurity region 2810. On the surface if the FZ substrate 281 opposite to the support substrate 284, there are formed a p⁺ type impurity region 282 in a rear surface, which has been doped with, for example, B, and an anode electrode 2812 which constitutes an electrode of the region 282. Moreover, an insulation film 3022 made of, for example SiO₂, is formed between the cathode electrode 2813 and the support substrate 284.

This embodiment has such a construction that the FZ substrate 281 and support substrate 284 are disposed inversely in the vertical direction, compared with the fourteenth embodiment. As described in the fourteenth embodiment, for measurement of radiation or the like whose depth of penetration into Si is relatively small, it is preferable that the radiation is incident at the p⁺ type impurity region 282 on the rear surface side opposite to the p type impurity region 287 which forms an amplifying region. If the p⁺ type impurity region 282 on the rear surface is located on the side opposite to the support substance 284 as in this embodiment, the p type impurity region 287 approaches the radiation source or the like by the amount of thickness of the substrate 281 so that measurement can be conducted.

FIGS. 32A to 32H and FIGS. 33I to 33M are schematic sectional views showing a process in a method of manufacturing an avalanche photodiode in accordance with an eighteenth embodiment of the present invention, respectively.

Figure 32A:
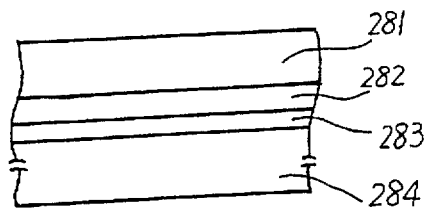
FIGS. 32A to 32H are schematic sectional diagrams showing a process of manufacturing an avalanche photodiode in accordance with an eighteenth embodiment of the present invention.

FIG. 32A shows a substrate manufactured in the following steps. A p⁺ type impurity region 282 on the rear surface is formed by injecting B or BF₂ ions in an FZ substrate 281 made of a p⁻ silicon with a face orientation (100), which has a resistivity of, for example, 50 Ω.cm or more, and a thickness of 300 μm. Thereafter, a support substrate 284 made of a silicon CZ substrate having a face orientation (100) and a thickness of 400 μm is adhered to the region 282 through an insulation film 283 made of a heat oxide film having a thickness of approximately 1 μm by heat pressure contact or electrostatic pressure contact. Subsequently, the FZ substrate 281 on the side where the p⁺ type purity region 282 has not been formed is ground so that the thickness of the FZ substrate 281 becomes 30 μm, and the total thickness of the substrate becomes 430 μm.

Figure 32B:
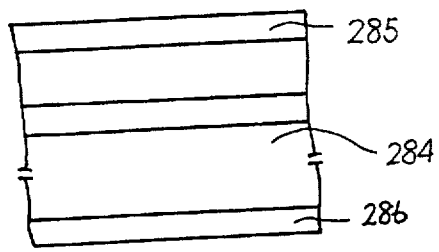

FIG. 32B shows a process of forming an oxide film 285 by heat oxidation. At this time, an oxide film 286 is also formed on the surface of support substrate 284.

Figure 32C:
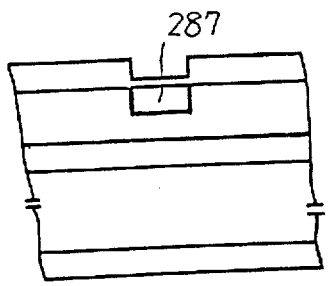

FIG. 32C shows a process of forming a p type impurity region 287 which constitutes an amplifying region. A window is opened in the oxide film 285 by photolithography, B is ion-injected into the window with a dose amount of approximately 5E12 to 5E13 atoms/cm², and subsequently B is diffused at 100° C. or more after the surface has been oxidized at the thickness of approximately 200 nm so that the depth of diffusion is set to 2 to 3 μm.

Figure 32D:
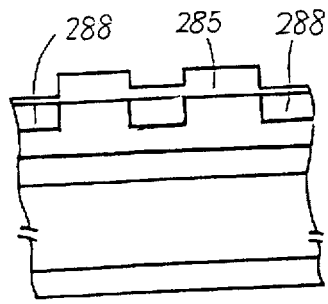

FIG. 32D shows a process of forming a p⁺ type impurity region 288 which constitutes a channel stopper. A window is opened in the oxide film 285 by photolithography, and after B or BF₂ has been ion-injected into the window with a dose amount of 5E14 atoms/cm² or more, it is diffused at 950° C. or more. In the case of injecting BF₂, such an effect that the p⁺ type impurity region 288 getters a heavy metal and a crystal defect is heightened, as a result of which an avalanche photodiode which reduces leakage current can be formed.

Figure 32E:
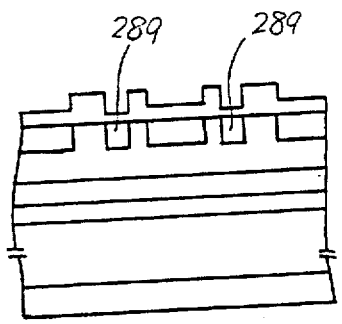

FIG. 32E shows a process of forming a deep n⁺ type impurity region 289 to elevate a breakdown voltage by making the diffusion depth of an edge portion in the n⁺ type impurity region deep. A window is opened in the oxide film 285 by photolithography, and after phosphorus has been ion-injected into the window with a dose amount of 5E14 atoms/cm² or more, it is diffused at 950° C. or more.

In this process, in order to make the diffusion deep, it is preferable to ion-inject not As but P.

Figure 32F:
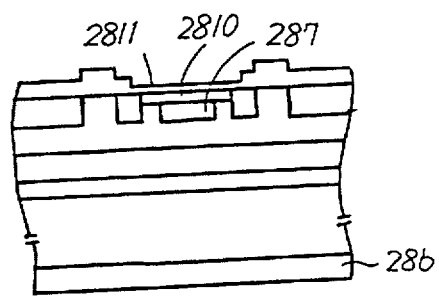

FIG. 32F shows a process of forming an n⁺ type impurity region 2810 on the upper portion of the p type impurity region 287 formed by the process of FIG. 32C. The n⁺ type impurity region 2810 is formed in such a manner that the edge portion of the region 2810 overlaps with the deep n⁺ type impurity region 289 formed by the process of FIG. 32E. A window is opened in the oxide film 285 by photolithography, and after P or As has been ion-injected with a dose amount of 3E13 atoms/cm² or more, it is diffused at 900° to 1,000° C.

Figure 32G:
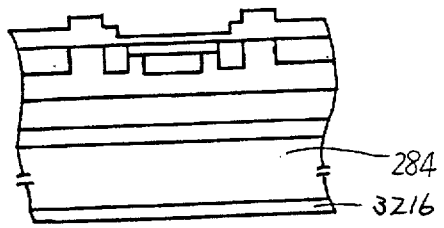

FIG. 32G shows a process of forming a thick oxide film 3216 of 10 to 500 nm by etching an oxide film 286 on the surface of the support substrate 284. If the thickness of the oxide film 3216 is thinner than 10 nm, an Si₃N₄ film formed by a subsequent process is damaged by stress, whereas if it is thicker than 500 nm, the accuracy of patterning in a process of FIG. 33K is deteriorated. The oxide film 3216 may be newly formed after the oxide film 286 has completely been removed.

Figure 32H:
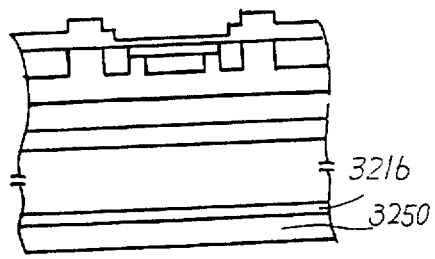

FIG. 32H shows a process of forming an Si₃N₄ film 3250 on the oxide film 3216 on the surface of the support substrate 284. It is preferable to deposit the Si₃N₄ film 3250 at 700° C. or more by low pressure CVD since the film 3250 forms a mask for etching made in a process of FIG. 33K. In this process, on a surface opposite to the substrate, there is formed a susceptor and a Si₃N₄ film is not deposited. However, after the Si₃N₄ films have been deposited on both surfaces, only the Si₃N₄ film on one surface may be removed. The Si₃N₄ film is set preferably to 300 nm or less, more preferably to 160 nm or less, even though the Si₃N₄ film is made thick so as to prevent an adverse effect on the FZ substrate 281 due to its stress.

Figure 33I:
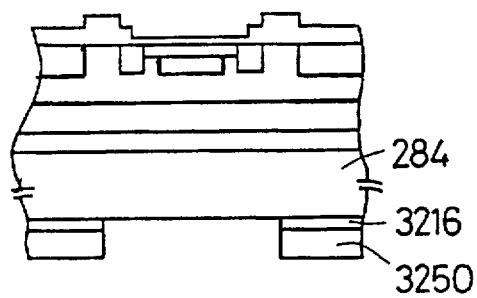
FIGS. 33I to 33M are schematic sectional diagrams showing further steps in a process of manufacturing an avalanche photodiode in accordance with the eighteenth embodiment of the present invention.
Figure 33K:
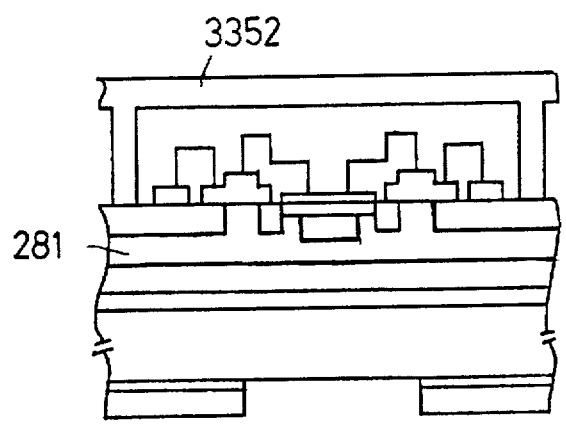

FIG. 33I shows a process of patterning the Si₃N₄ film 3250 and the oxide film 3216 on the surface of the support substrate 284. The patterning of the Si₃N₄ film 3250 must be made so that an edge portion of a pattern is identical with a <110> direction of the support substrate 284 with accuracy. This process may be performed after a process of FIG. 33J.

Figure 33J:
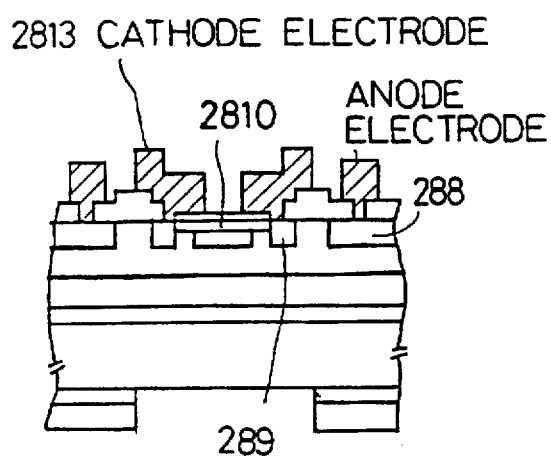

FIG. 33J shows a process of forming, on the surface of the FZ substrate 281, an anode electrode which forms an electrode for the p⁺ type impurity region 288, and a cathode electrode 2813 which forms an electrode for the n⁺ type impurity region 289 and the n⁺ type impurity region 2810.

FIG. 33K shows a process of anode-joining a boro silicate glass 3352 onto the surface of the FZ substrate 281. This boro silicate glass 3352 has a role of protecting the surface of the FZ substrate 281 when etching the support substrate 284 in a process of FIG. 33M.

Figure 33L:
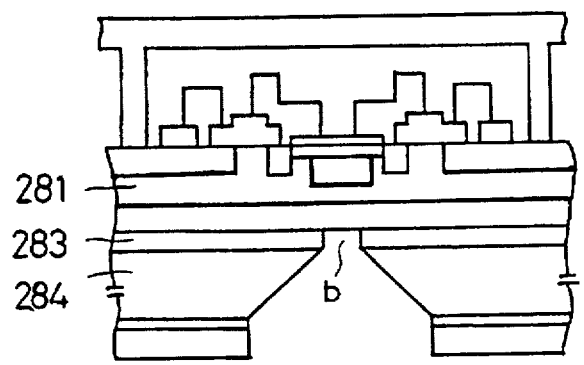

FIG. 33L shows a process of subjecting the support substrate 284 made of silicon with a face orientation (100) to anisotropic etching with KOH, an EDP (a mixing liquid of ethylene diamine, pyrocatechol and water) and an etchant such as hydrazine with a mask formed by the Si₃N₄ film 3250 which has been patterned in FIG. 33I, and subsequently etching the insulation film 283 made of an oxide film to have the surface of the FZ substrate 281 exposed to define an opening b.

When the above-mentioned etchant is used, the support substrate 284 is etched in the form of an inverse pyramid with a (111) surface which constitutes a side. The etching rate of silicon in a face orientation (100) when using KOH and EDP is 1 μm/min or more. Moreover, when the etched hole reaches the insulation film 283, if the insulation film is formed by an oxide film, the etching rate is as low as approximately 1 nm/min or less. Therefore, the surface of the FZ substrate 281 does not become rough or damaged.

Subsequently, if etching is made with HF or the like, the insulation film 283 which is an oxide film is removed. In this process, the dry etching or the like other than the above-mentioned method is not proper because the etching rate is low in view of the fact that the thickness of the support substrate 284 is 100 μm or more.

Furthermore, the mechanical grinding gives damage to the device after the device has been formed to some degree, and on the other hand, before forming the device, a part which has been made as thin as approximately 50 μm cannot withstand the heat treatment and the like during the device manufacturing process.

Figure 33M:
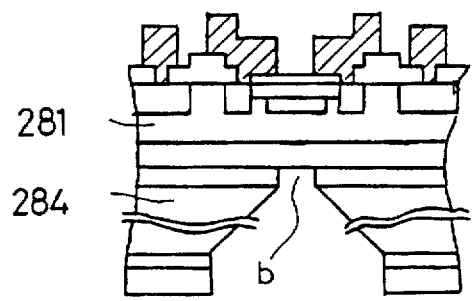

FIG. 33M shows a process of dicing the FZ substrate 281 and the support substrate 284 inside of the FZ substrate 281 which has been anode-joined to boro silicate glass 3352 so as to be cut off.

As in this embodiment, if a process of removing the support substrate 284 is performed after an impurity doping process for the FZ substrate 281 has completely been finished, an avalanche photodiode having excellent characteristics can be obtained because the FZ substrate 281 suffers from no damages caused by high-temperature heat treatment, and the manufacturing yield is also improved.

As described above, in accordance with the present invention, the avalanche photodiode having an opening on the side of the support substrate 284 of the above-mentioned fourteenth embodiment can be manufactured without any damage to the FZ substrate 281.

FIGS. 34I to 34N are schematic sectional views showing a method of manufacturing an avalanche photodiode in accordance with a nineteenth embodiment of the present invention. In this embodiment, the process is halfway identical with the process of the eighteenth embodiment shown in FIGS. 32A to 32H. Therefore, the process after the step of FIG. 32H will be described.

Figure 34I:
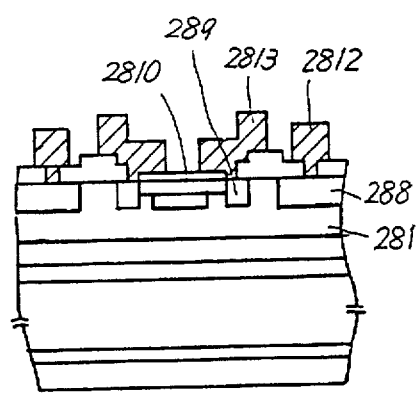
FIGS. 34I to 34N are schematic sectional diagrams showing steps in a process of manufacturing an avalanche photodiode in accordance with a nineteenth embodiment of the present invention.

FIG. 34I shows a process of forming an anode electrode 2812 which forms an electrode of the p$^+$ type impurity region 288, and a cathode electrode 2813 which forms an electrode for the deep n$^+$ type impurity region 289 and the n$^+$ type impurity region 2810 on the surface of the FZ substrate 281.

Figure 34L:
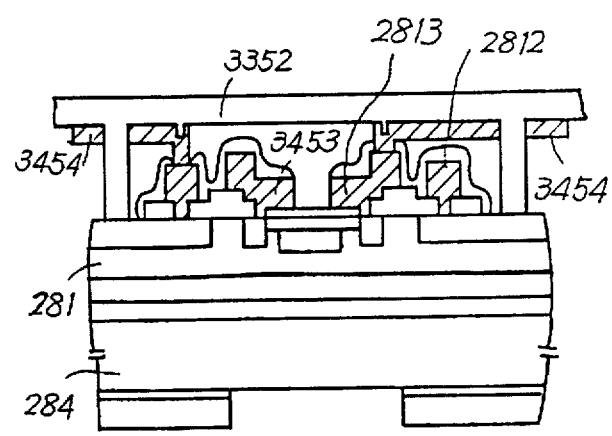
Figure 34J:
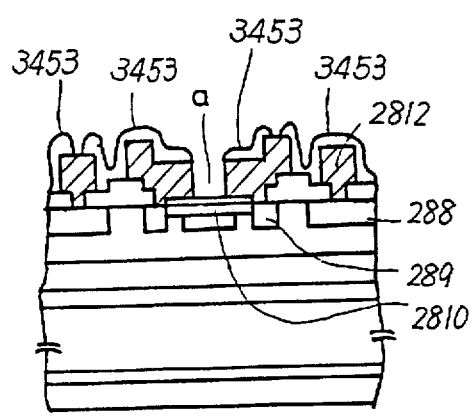

FIG. 34J shows a process of depositing and patterning a passivation film 3453. The passivation film 3453 is preferably a plasma nitride film, and is patterned in such a manner that it is removed in a light receiving region a, a part of the p$^+$ type impurity region 288 on the anode electrode 2812, and a part of the n$^+$ type impurity 289 and the n$^+$ type impurity region 2810 on the cathode electrode 2813.

Figure 34M:
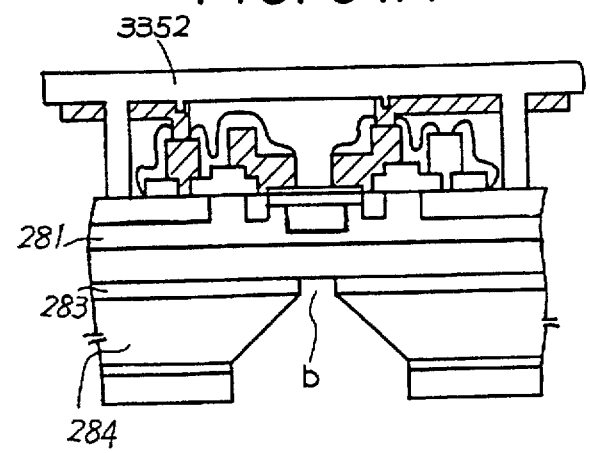
Figure 34K:
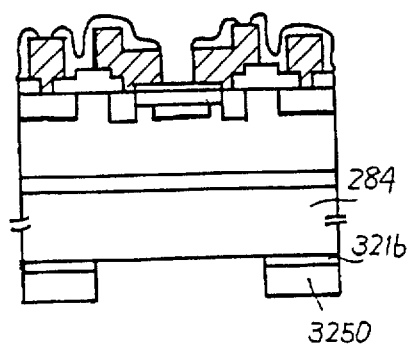

FIG. 34K shows a process of patterning the $Si_3N_4$ film 3250 and the oxide film 3216 on the surface of the substrate 284. The patterning of the $Si_3N_4$ film 3250 must be made in such a manner that an edge portion of the pattern is identical with the <110> direction of the support substrate 284 with accuracy.

FIG. 34L shows a process of anode-joining borosilicate glass 3352 onto the surface of the FZ substrate 281. In this embodiment, an electrode 3454 and an electrode 3455 are formed on the borosilicate glass 3352 in such a manner that the anode electrode 2812 and the cathode electrode 2813 are brought in contact with a portion of the window in the passivation 3453. Simultaneously when forming the anode-junction, these electrodes are also brought in contact with the portion of the window. The passivation 3453 is necessary to prevent a short-circuit between the electrode 3454 and the cathode electrode 2813 and between the electrode 3455 and the anode electrode 2812.

This process is performed for protecting the surface of the FZ substance when etching the support substrate 284 in the subsequent process, simultaneously while fixing the FZ substrate to an equipped substrate.

FIG. 34M shows a process of subjecting the support substrate 284 made of silicon with a face orientation (100) to anisotropic etching in the same manner as that in FIG. 33L, and subsequently etching the insulation film 283 made of oxide to have the surface of the FZ substrate 281 exposed to form an opening b.

Figure 34N:
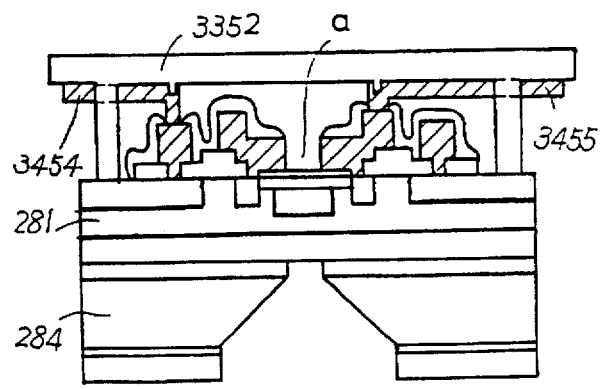

FIG. 34N shows a process of dicing the FZ substrate 281 and the substrate 284 outside of a portion where the FZ substrate 281 has been anode-joined to the borosilicate glass 3352, and further of dicing the borosilicate glass 3352.

If it is desired to allow light, radiation or the like to be incident also from the light receiving region a, a hole is formed in the borosilicate glass 3352 as shown in the figure.

As described above, in accordance with this embodiment, the avalanche photodiode having an opening on the side of the support substrate 284 in the fourteenth embodiment can be manufactured without any adverse effect on the FZ substrate 281, and further the number of processes is reduced since the protection of the surface of the FZ substrate at the time of etching the support substrate 284 and fixing to an equipped substrate are performed simultaneously. Furthermore, since the FZ substrate is rigidly fixed to the glass substrate by the anode-junction, it is strong in heat, and since an adhesive or the like is not used, a gas is not omitted, as a result of which a device suitable for high temperature and high vacuum can be provided.

FIGS. 35A, 35H to 35L are schematic sectional views showing a process in a method of manufacturing an avalanche photodiode in accordance with a twentieth embodiment of the present invention.

Figure 35A:
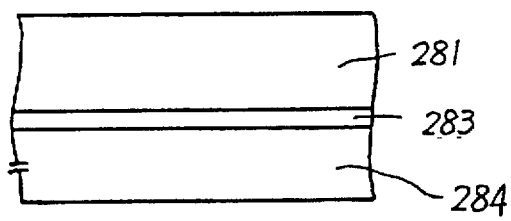
FIGS. 35A, 35H to 35L are schematic sectional diagrams showing steps in a process of manufacturing an avalanche photodiode in accordance with a twentieth embodiment of the present invention.

FIG. 35A shows a substrate in which an FZ substrate 281 made of a p$^-$ silicon with a face orientation (100) which has a resistivity of 50 Ω.cm or more and a thickness of 300 μm, and a support substrate 284 made of a silicon CZ substrate with a face orientation (100) which has a thickness of 400 μm are adhered through an insulation film 283 made of a heat oxide film whose thickness is approximately 1 μm, the FZ substrate 281 subsequently being ground so as to have a thickness of 30 μm, as a result of which a substrate having a total thickness of 430 μm is formed.

Being different from the above-descried eighteenth embodiment or the nineteenth embodiment, B or $BF_2$ ions are not injected into the FZ substrate 281, and therefore no p$^+$ type impurity region is formed.

Figure 35J:
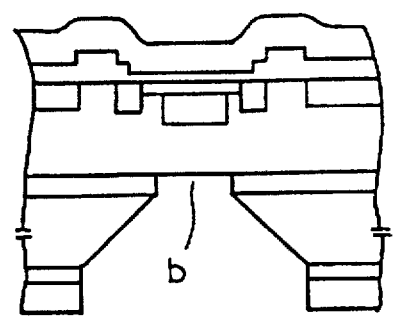
Figure 35H:
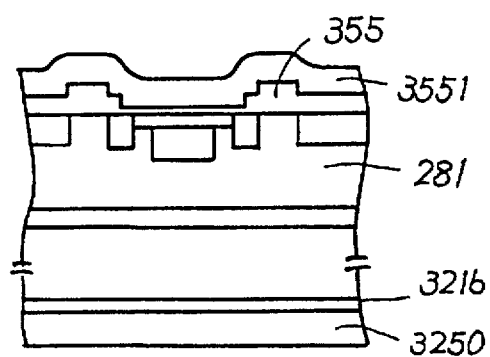

Thereafter, the processes before the process of FIG. 35H are the same as those of the above-described eighteenth embodiment shown in FIGS. 32B to 32G, and the doping and diffusion processes have been finished except for a surface of the FZ substrate 281 on the side of the support substrate 284.

Figure 35K:
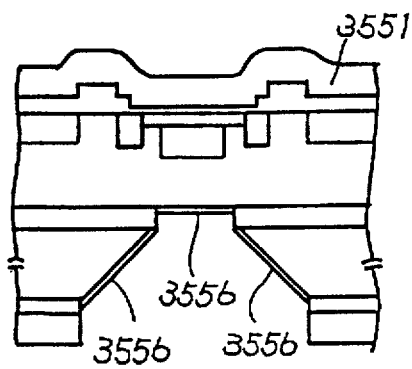

FIG. 35H shows a process of forming a $Si_3N_4$ film 3250 on the oxide film 3216 on the surface of the support substrate 284, and a $Si_3N_4$ film 3551 on the FZ substrate 281, respectively. The $Si_3N_4$ film 3250 and the $Si_3N_4$ film 3551 can be simultaneously deposited on both surfaces by the pressure-reduction CVD method. When the ion injection is performed instead of the processes in FIGS. 36J, 35K and 35L, the $Si_3N_4$ film 3551 may not be deposited.

Figure 35I:
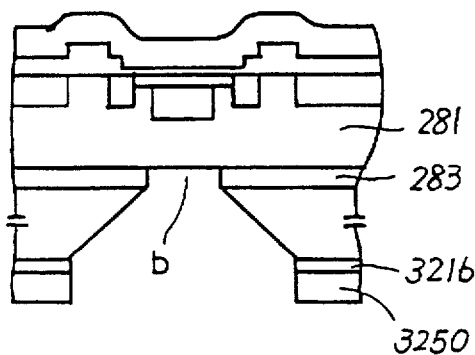

FIG. 35I shows a process of patterning the $Si_3N_4$ film 3250 and the oxide film 3216 on the surface of the substrate 284 in the same manner as that of FIG. 33I described in the eighteenth embodiment, and also subjecting the substrate 284 made of silicon with a substrate (100) orientation to anisotropic etching by KOH, EDP, hydrazine and the like with a mask of the patterned $Si_3N_4$ film 3250, and hereafter etching the insulation film 283 made of an oxide to have the surface of the FZ substrate 281 exposed to form an opening b.

FIG. 35J shows a process of removing a natural oxide film on the surface of the opening b in the FZ substrate 281 to have an active surface of silicon exposed. The substrate is immersed in a dilute hydrofluoric acid of 0.5% HF degree so that it is difficult to have the natural oxide film formed on the surface of the opening b of the FZ substrate 281. Subsequently, the substrate is located within a vacuum device, heated at 800° C. or more, and held under a background pressure 10-4 Pa or less for ten minutes or more. At this time, it is preferable to introduce a hydrogen gas.

FIG. 35K shows a process of introducing a boron compound gas such as $B_2H_6$ gas onto the active surface of the FZ substrate 281 to form a film 3556 made of boron or boron silicide.

In this process, when gas is introduced so that the product of the introduction pressure of the $B_2H_6$ gas and introduction time becomes 4.3 Pa.sec or more, doping with a high control performance can be performed.

When the substrate temperature at the time of introducing the $B_2H_6$ gas is at 300° to 700° C., a boron film is formed and when at a temperature over 700° C. a boron silicide film is formed.

Under the condition of introducing the $B_2H_6$ gas as described above, when the substrate temperature is at 600° C., a boron film of approximately 10 nm is deposited, and when the substrate temperature is at 800° C., a boron silicide film having the substantially the same thickness is formed.

If both of the boron film and the boron silicide film having a thickness of 10 nm or more are formed, the diffusion from the boron silicide diffusion source toward Si (substrate) is a diffusion having a constant surface density determined by a solid melting limit at a diffusion temperature, thereby enabling uniform doping with a high control performance.

Further, the deposit of the boron film is made by heat CVD, and the formation of boron silicide is made by reaction of boron and Si within a $B_2H_6$ gas, which is entirely different from the CVD. The boron silicide film is more stable than the boron film and performs diffusion with a higher control performance. The $Si_3N_4$ film 3551 is necessary for preventing the surface of the FZ substrate 281 from being doped with boron. In this process, the oxide film cannot be used as a mask.

If the boron or boron silicide film is formed by the above-mentioned method, even though there is a three-dimensional structure such as an inside wall of a groove, a film having a uniform thickness is formed. Furthermore, in such a case as to deposit polysilicon by the LPCVD, a boron or boron silicide film can be uniformly deposited on a large number of substrates by the batch process once.

In the case where a boron film is deposited by sputtering, since there is a shadowing, it is not suitable for doping in the case of a three-dimensional structure as in this process. Further, in the sputtering or plasma CVD method, it is impossible to uniformly form a boron film on a large number of substrates by the batch process once.

Figure 35L:
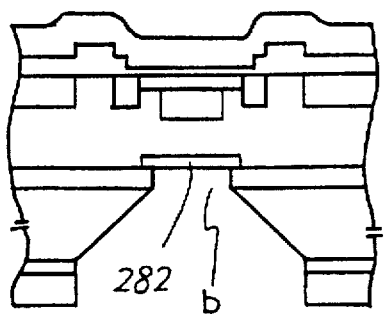
Figure 36:
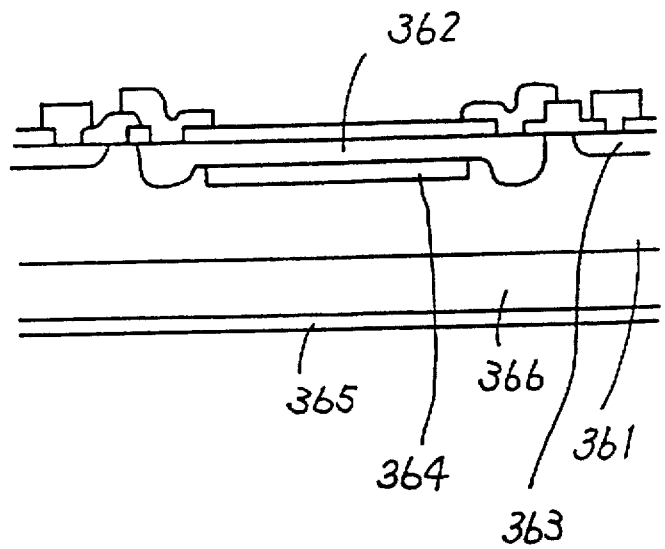
FIG. 36 is a schematic sectional view showing a conventional avalanche photodiode.
Figure 37:
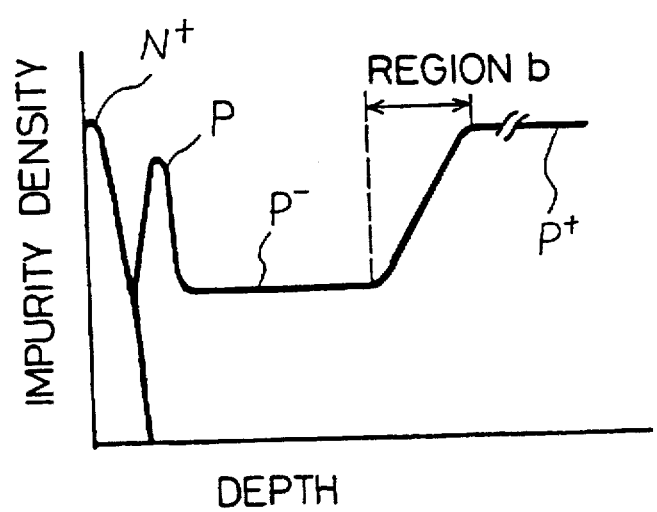
FIG. 37 is a schematic diagram showing an impurity density profile in a section of an FZ epitaxial substrate.
Figure 38:
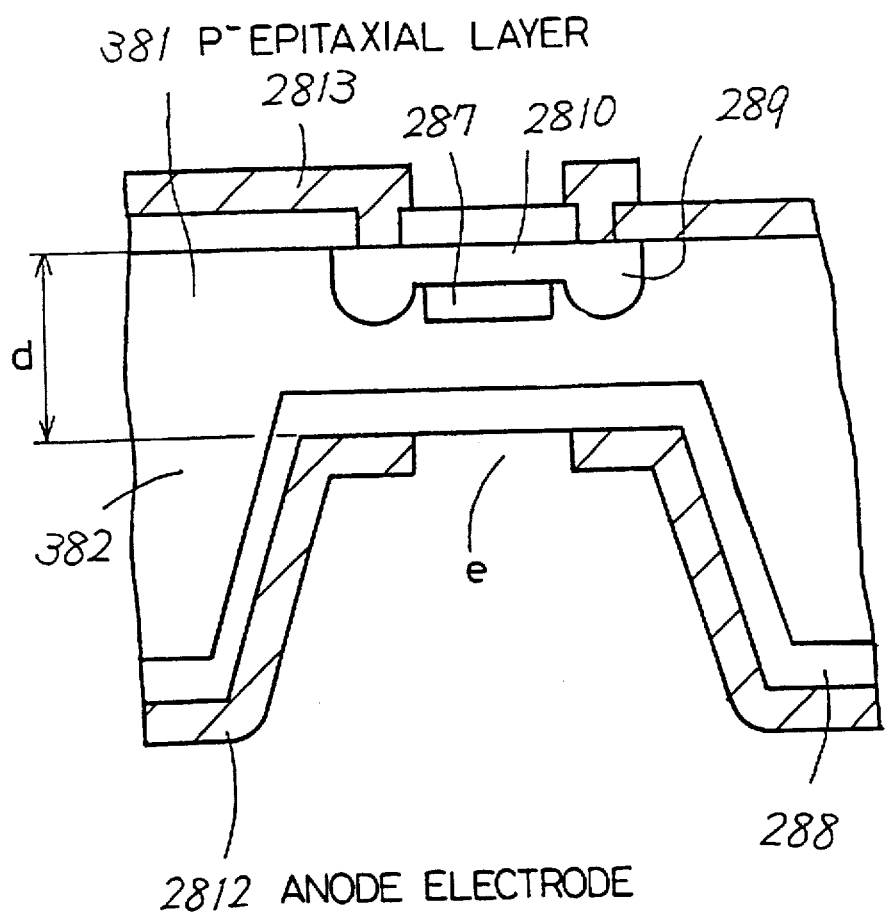
FIG. 38 is a schematic sectional view showing an example of another conventional avalanche photodiode.

FIG. 35L shows a process of forming a $p^+$ type impurity region 282 on the rear surface by heat diffusion with a boron or boron silicide film 3556 formed on the surface of the FZ substrate 281 at the opening b which constitutes a diffusion source. As described above, since this diffusion is made from the front surface, it is possible to form a shallow diffusion region without damage.

For example, when a furnace annealing is performed at 900° C. for 30 minutes under the nitrogen atmosphere, a $p^+$ type impurity region 282 on the rear surface, which has a diffusion depth of 250 nm and a peak density of 8E19, can be obtained. In accordance with the RTA, the diffusion depth of approximately 100 nm can be obtained.

Even if a $BF_2$ ion injection is performed instead of the processes of FIGS. 35J, 35K and 35L, the $p^+$ type impurity region 282 on the rear surface can be formed.

After having performed the process of FIG. 35L, the anode electrode 2812 and the cathode electrode 2813 are formed in the same manner as the process of FIG. 33J described in the eighteenth embodiment.

As described above, in accordance with this embodiment, since an impurity doping process for a portion of the FZ substrate 281 where the support substrate 284 has been removed is carried out at the final state of the doping process, it is easy to make the impurity diffusion layer thin. Consequently, in the case where radiation or the like is incident from the side of the $p^+$ type impurity region 282 having a very thin thickness, an avalanche photodiode which can obtain a very excellent efficiency of detection can be manufactured.

A p type impurity region which is an amplifying region in contact with an $n^+$ type impurity region is formed by ion implantation. Besides, a p type impurity region can be formed by a doping method of this invention, namely precisely controlled solid phase diffusion according to FIG. 12.

Figure 51A:
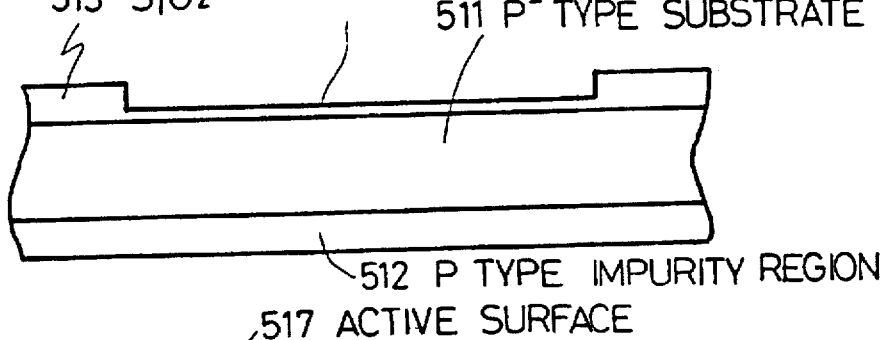
FIGS. 51A to 51E are schematic sectional diagrams showing a process of manufacturing a p type impurity region of an avalanche photodiode in accordance with this embodiment of the present invention.

Detailed descriptions are given in FIGS. 51A to 51E. FIG. 51A shows a process of removing a natural oxide film 514 on the $p^-$ substrate 511 to have an active surface of silicon exposed. The substrate is immersed in a dilute hydrofluoric acid of 0.5% HF degree so that it is difficult to have a natural oxide film formed on the surface of the $p^-$ substrate 511. Subsequently, the substrate is located within a vacuum device, heated at 800° C. or more, and held under a background pressure $10^{-4}$ Pa or less for ten minutes or more. In order to expose the active surface of silicon, it is preferable to introduce a hydrogen gas.

Figure 51B:
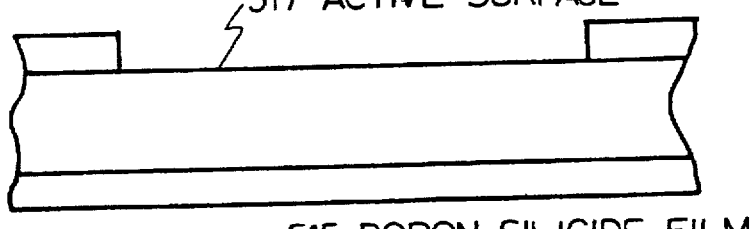
Figure 51C:
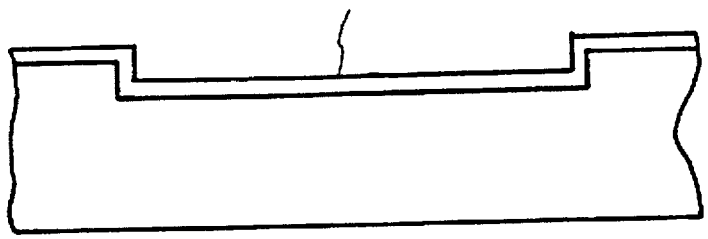

FIG. 51B shoes a process of introducing a boron compound gas such as a $B_2H_6$ gas onto $p^-$ substrate 511. FIG. 51C shows a process of forming a boron or boron silicide 515. In this process, forming a boron or boron silicide, when gas is introduced so that the product of the introduction pressure of $B_2H_6$ gas and introduction time becomes 4.3 Pa.sec or more, doping with a high control performance can be performed. When the substrate temperature at the time of introducing the $B_2H_6$ gas is at 300° to 700° C., a boron film is formed and when at the temperature over 700° C., a boron silicide film is formed. Under the condition of introducing the $B_2H_6$ gas as described above, when the substrate temperature is at 600° C., a boron film of approximately 10 nm is deposited, and when the substrate temperature is at 800° C., a boron silicide film having substantially the same thickness is formed. If both of the boron film and the boron silicide film having a thickness of 10 nm or more are formed, the diffusion from these diffusion sources toward Si (substrate) is a diffusion having a constant surface density determined by a solid melting limit at a diffusion temperature, thereby enabling uniform doping with a high control performance.

Further, the deposition of the boron film is made by heat CVD, and the formation of a boron silicide film is made by reaction of boron and Si within a $B_2H_6$ gas, which is entirely different from the CVD. The boron silicide film is more stable than the boron film and performs diffusion with a higher control performance.

Figure 51D:
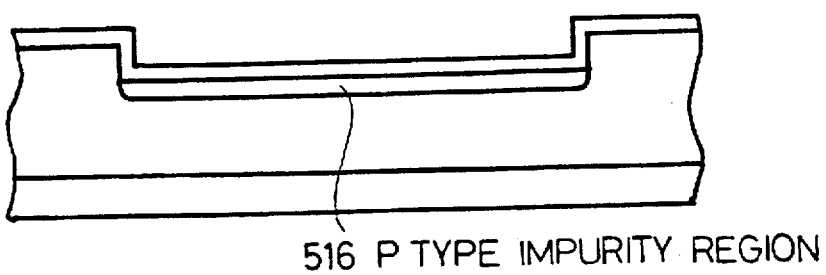
Figure 51E:
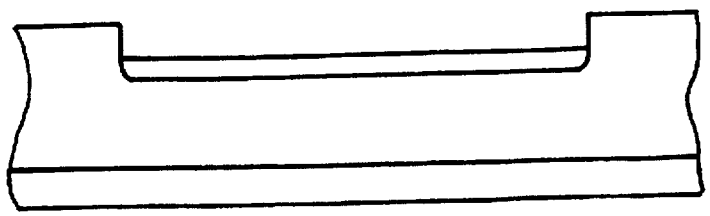

For example, FIG. 51D shows diffusion, when a furnace annealing is performed at 900° C. for 30 minutes under a nitrogen atmosphere, a p type impurity region 516, which has a diffusion depth of 250 nm and a peak density of 8E19, can be obtained.

In accordance with the RTA, a diffusion depth of approximately 100 nm can be obtained. Boron or boron silicide film 515 can be removed by oxidation at low temperature of approximately 600° C. In this method, a shallow and residue damage-free diffusion region can be obtained. An ion implantation of As is preferable to form an $n^+$ type impurity region.

As described above, by forming a p type impurity region on an amplifying region, an avalanche photodiode having a thin insensitive layer, which does not contribute to generate photo signals, and a sharp impurity profile, not having tailing, and a high gain amplitude can be formed.

Figure 39:
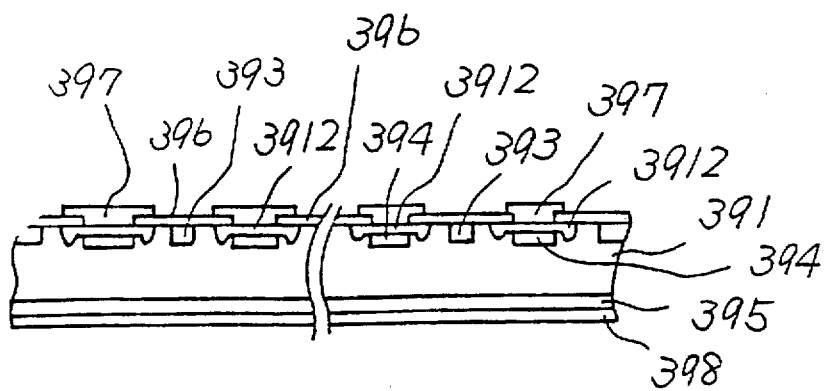
FIG. 39 is a schematic sectional view showing an avalanche photodiode in accordance with a twenty-first embodiment of the present invention.

FIG. 39 is a schematic sectional view showing an avalanche photodiode in accordance with a twenty-first embodiment of the present invention. For example, a plurality of $n^+$ type impurity regions 3912 in the form of strips which have been doped with As or P are formed on one surface of a $p^-$ substrate 391 made of silicon having a resistivity of 50 Ω.cm or more, and each of p type impurity regions 394 are formed under the impurity regions 3912. An angular portion of these impurity regions is formed with a curvature and arranged so as not to be concentrated in an electric field. A $p^+$ type impurity region 393 is formed in the periphery of the strip shaped $n^+$ type impurity regions 3912. An $SiO_2$ film 396 is formed on those regions by heat oxidation.

A cathode electrode 397 which is an electrode for the strip shaped $n^+$ type impurity regions is formed on the $SiO_2$ film 396. A $p^+$ impurity region 395 doped with, for example, boron and an anode electrode 398 are formed on a surface opposite to the side of the $p^-$ type substrate 391. When particle radiation, x-rays or the like such as electron radiation is incident, the $SiO_2$ film on this portion needs to be removed.

Figure 40:
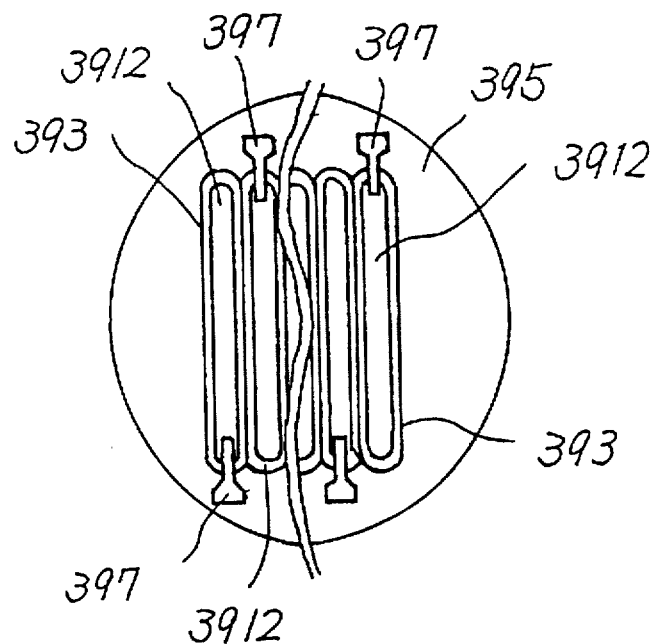
FIG. 40 is a schematic diagram showing the arrangement of an impurity region in an avalanche photodiode in accordance with the twenty-first embodiment of the present invention.

FIG. 40 is a schematic diagram showing an arrangement of an impurity region of an avalanche photodiode in accordance with the twentieth embodiment of the present invention, in which a plurality of strip shaped $n^+$ type impurity regions 3912 are formed in such a manner that they are disposed inside of a circular $p^+$ type impurity region 395.

Figure 41:
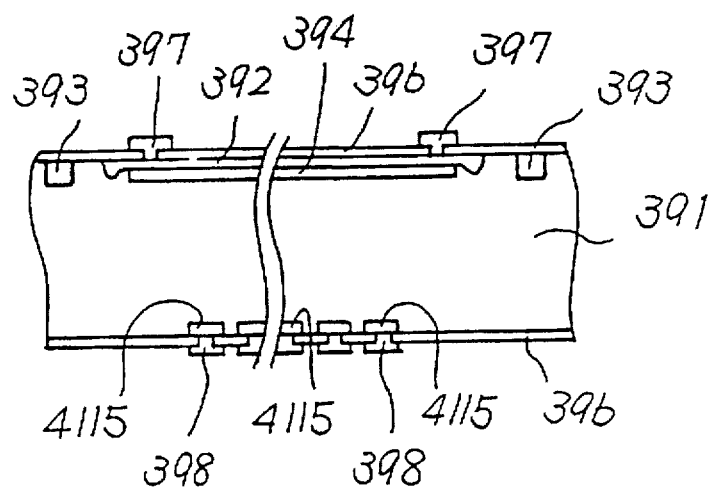
FIG. 41 is a schematic sectional view showing an avalanche photodiode in accordance with a twenty-second embodiment of the present invention.

FIG. 41 is a schematic sectional view showing an avalanche photodiode in accordance with a twenty-first embodiment of the present invention. On one surface of the $p^-$ substrate 391, there are formed an $n^+$ type impurity region 392, a $p^+$ type impurity region 393, a p type impurity region 394, an $SiO_2$ film 396, and a cathode electrode 397. On the other surface, a plurality of strip shaped $p^+$ type impurity regions 4115 are formed, and an anode electrode 398 is formed for each of the impurity regions 4115. It is preferable to form the anode electrodes 398 on the $p^+$ type impurity region through an $SiO_2$ film 396 in the same manner as the cathode electrode 397.

Figure 42:
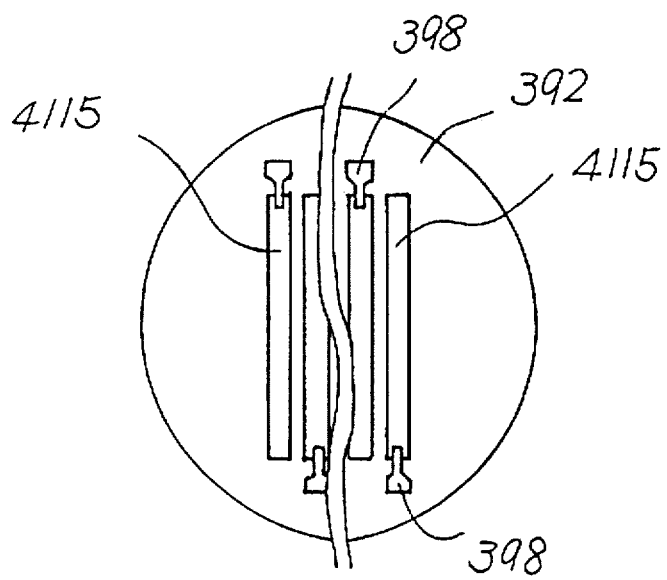
FIG. 42 is a schematic diagram showing the arrangement of an impurity region in an avalanche photodiode in accordance with the twenty-second embodiment of the present invention.

FIG. 42 is a schematic diagram showing an arrangement of an impurity region of an avalanche photodiode in accordance with the twenty-first embodiment of the present invention, in which a plurality of strip shaped $p^+$ type impurity regions 4115 are formed in such a manner that they are disposed inside of a circular $n^+$ type impurity region 392.

In FIGS. 40 and 42, the $p^+$ type impurity region 395 and the $n^+$ type impurity region 392 which do not have a strip shape have a structure so as not to make the field concentration difficult, and therefore these regions are not always circular. In this embodiment, the shape of these regions simply matches that of the substrate.

In accordance with the twentieth and twenty-first embodiments of the present invention, linear information of incident light can be obtained.

Figure 43:
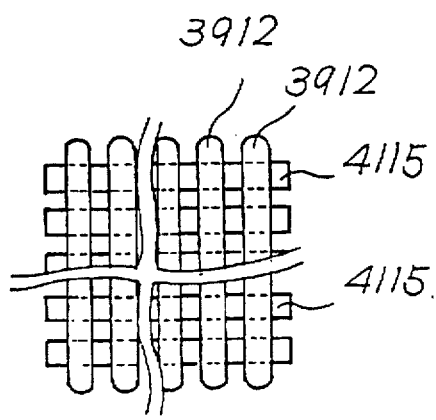
FIG. 43 is a schematic diagram showing the arrangement of an impurity region in an avalanche photodiode in accordance with a twenty-third embodiment of the present invention.

FIG. 43 is a schematic diagram showing an arrangement of an impurity region in an avalanche photodiode in accordance with a twenty-second embodiment of the present invention, in which both an $n^+$ type impurity region and a $p^+$ type impurity region are in the form of strips. In the figure, strip shaped $n^+$ type impurity regions 3912 and strip shaped $p^+$ type impurity regions 4115 are formed so as to be orthogonal with each other. With such a construction, two-dimensional information can be obtained.

Furthermore, any one of a $p^+$ type impurity region 395 and an $n^+$ type impurity region 392 is made in the form of a strip, or a substrate is made in a plurality of strips which are in parallel with each other, and laminated on both regions simultaneously so that light or the like is incident from a side thereof, as a result of which a two-dimensional light detection function can be carried out.

Figure 44:
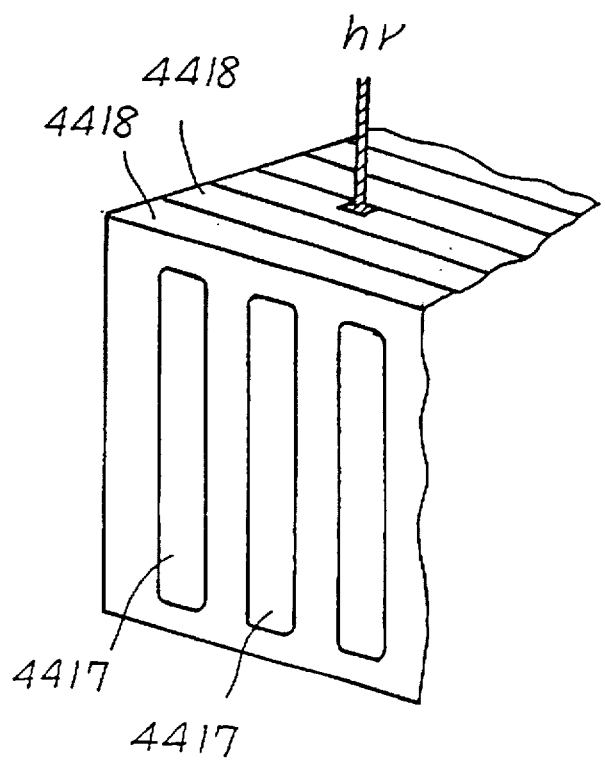
FIG. 44 is a general perspective view showing an avalanche photodiode in accordance with a twenty-fourth embodiment of the present invention.

In other words, FIG. 44 is conceptual perspective view of an avalanche photodiode in accordance with a twenty-third embodiment of the present invention, in which a plurality of avalanche photodiodes 4418 having an impurity region 4417 that is one of a $p^+$ or $n^+$ type and is constituted in the form of a strip are aligned in a direction of the strip and laminated, and an electromagnetic wave or radiation is incident from a side thereof to the strips in parallel. As a result, a lamination type two-dimensional detection avalanche photodiode, which provides a two-dimensional detecting function, can be obtained.

Figure 45:
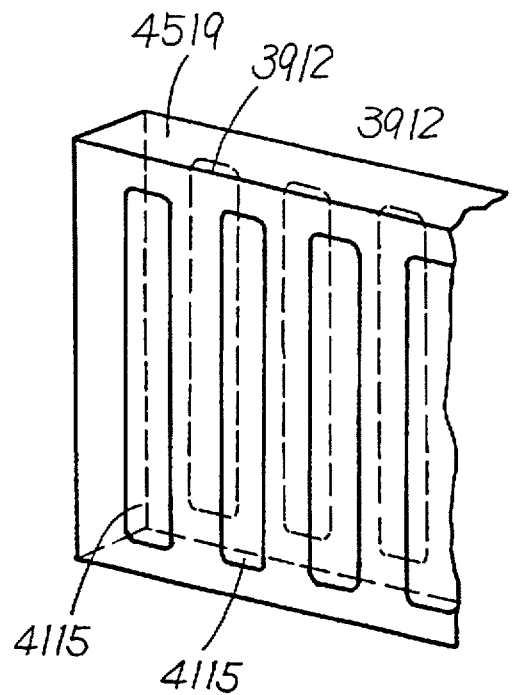
FIG. 45 is a schematic diagram showing the arrangement of an impurity region in an avalanche photodiode in accordance with a twenty-fifth embodiment of the present invention.

Further, as shown by a schematic diagram of an arrangement of an impurity region in FIG. 45, a plurality of avalanche photodiodes 4519, in which both of a $p^+$ type impurity region 4115 and an $n^+$ type impurity region 3912 are simultaneously made in the form of strips which are in parallel with each other in the same direction, are laminated in the same manner so that an electromagnetic wave or radiation is incident from a side thereof. As a result, a lamination type two-dimensional detection avalanche photodiode with a two-dimensional detecting function of a second type in accordance with a twenty-fourth embodiment of the present invention can be obtained.

With such a lamination two-dimensional detection avalanche photodiode, position resolution can be improved with relative ease.

In particular, with this lamination two-dimensional detection avalanche photodiode, the actual detection depth of incident radiation can be remarkably made large so that it is extremely effective in detection of x-rays or the like. In other words, in a non-lamination type avalanche photodiode, a region through which incident radiation passes is several tens μm in the thickness direction of the silicon substrate. On the other hand, in the lamination type of the present invention, because incident radiation is made incident from a side of the silicon substrate, a region through which the incident radiation passes can be several mm with an extreme simplicity.

Figure 46:
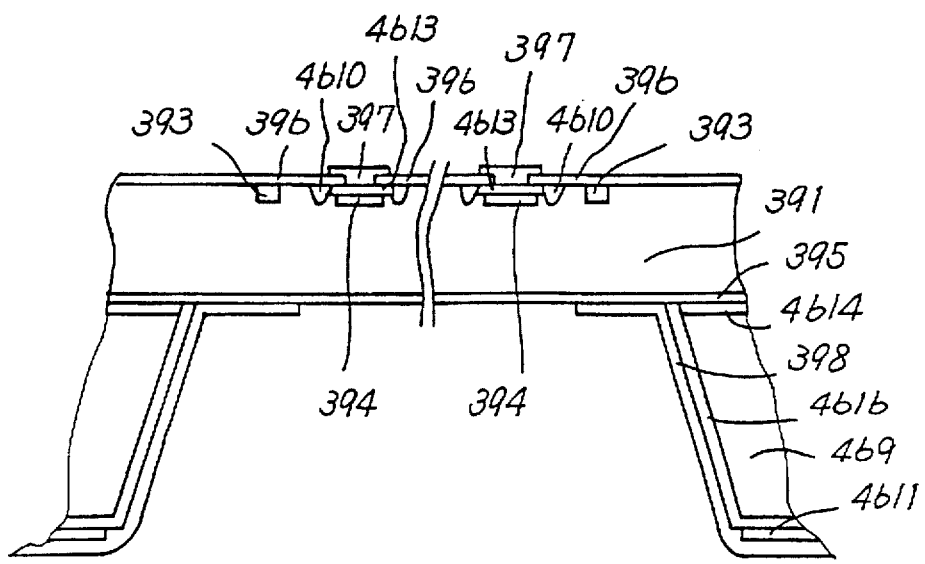
FIG. 46 is a schematic sectional view showing an avalanche photodiode in a manufacturing example in accordance with the twenty-first embodiment of the present invention.

Now, one example of a method of manufacturing an avalanche photodiode in accordance with the twentieth embodiment of the present invention will be described with reference to FIG. 46.

On p⁻ substrate 391 made of silicon having a face orientation (100), a thickness of 300 μm, and a resistivity of 50 Ω.cm or more, which has been manufactured by the floating zone method, a p⁺ type impurity region 395 is formed by injecting ions of B of $BF_2$ with a dose of $1 \times 10^{15}$ to $5 \times 10^{15}$ atoms/cm². This impurity region 395 and a support substrate 469 (hereinafter referred to as a "CZ substrate") made of silicon with a face orientation (100) manufactured by the Czochralski method for an insulation film, for example an $SiO_2$ film 4614 having a thickness of approximately 1 μm formed by heat oxidation, are adhered with each other by a heat pressure contact or an electrostatic pressure contact in such a manner that the $SiO_2$ film 4614 and the p⁺ type impurity region 395 are brought into contact with each other.

Thus, by making a lamination substrate, the physical strength is strong even when the p-type substrate is thin, and the deformation of the substrate and occurrence of dislocation slip during a heat treatment in a manufacturing process are reduced.

Since a substrate used for a lamination has an effect of reinforcing the substrate during the manufacturing process, a silicon substrate equal in the heat expansion factor is preferable as the substrate, and a substrate which has been crystal-grown by the Czochralski method which is strong in the heat treatment is most preferable. Furthermore, it is necessary that its thickness is at least 100 μm, preferably 200 μm or more.

With the structure of this embodiment, it is possible that the resistivity of the p⁻ substrate is made several kΩ.cm or more which cannot be obtained by an epitaxial substrate. Furthermore, the p⁺ type impurity region whose thickness cannot be several μm or less even though the region is ground into a thinner one in the case of using the epitaxial substrate, can be made to be 1 μm or less with ease in the construction of this embodiment, whereby a time resolution of the avalanche photo diode can be improved.

In the case where the thickness of a p⁻ type substrate in a usual avalanche photodiode, which does not provide the construction of the present invention, is 100 μm or less, there are severe problems that the manufacturing yield is lowered due to increase of cracks of a substrate and dislocation slip during the heat treatment and other manufacturing process, and the device performance is deteriorated due to increase of a reverse bias leakage current, and the like. On the other hand, when its thickness is 10 μm or less, the detection efficiency of x-rays is not practical. Consequently, this embodiment is very effective in a case where the thickness of the p⁻ substrate is 10 to 100 μm.

When dividing a p⁺ type impurity region or n⁺ type impurity region into a plurality of strips or a plurality of minute parts, since the influence of defects of a semiconductor substrate is particularly remarkable, the effect of this embodiment in accordance with the invention is extremely great.

Subsequently, after the p⁻ substrate 391 of this laminated substrate is ground so as to have a thickness of 30 μm, an $SiO_2$ film 396 is formed on the surface by heat oxidation. In this case, an $SiO_2$ film 4616 is also formed on the surface of the CZ substrate 469. Then, B or $BF_2$ is ion-injected with a dose of $5 \times 10^{12}$ to $5 \times 10^{13}$ atoms/cm² with a mask of the $SiO_2$ film 396, and the surface is oxidized so that an $SiO_2$ film having a thickness of 200 nm is formed. Subsequently, a p type impurity region 394 which constitutes an amplifying region having a depth of 2 to 3 μm is formed by heat treatment at 1,000° C. or more. Furthermore, a window is opened in the $SiO_2$ film, and B or $BF_2$ ions are injected into the window with a dose of $5 \times 10^{14}$ atoms/cm² or more, thereby to form a p⁺ type impurity region 393 which constitutes a channel stopper upon heat treatment at 950° C. or more.

Subsequently, after a window is again opened, P ions are injected into the window with a dose of $3 \times 10^{14}$ atoms/cm² or more, and then a shallow n⁺ type impurity region 4613 is formed by heat treatment at 950° C. or more.

In the above-mentioned way, a strip shaped n⁺ type impurity region is formed.

Next, after etching the thickness of the $SiO_2$ film 4616 on the surface of the CZ substrate 4369 into a proper thickness, an $Si_3N_4$ film 4611 is formed by pressure reduction CVD at a temperature of 700° C. or more. The $Si_3N_4$ film 4611 has a thickness of 300 nm or less even though it is made thicker to present an adverse effect of its stress on the p-type substrate, and preferably 160 nm or less if possible.

Subsequently, the $Si_3N_4$ film 4611 and the oxide film 4616 are subjected to patterning, and then a cathode electrode 397 which constitutes an electrode for the n⁺ type impurity region is formed on the surface of the p⁻ substrate 391. Thereafter, the surface of the p⁻ substrate 391 is covered with a proper glass for protection, and then the CZ substrate 469 of a face orientation (100) is subjected to anisotropic etching with a mask of the $Si_3N_4$ film 4611. Subsequently, the $SiO_2$ film 4614 is subjected to etching to have the p⁺ type impurity region 395 of the p⁻ type substrate 391 exposed.

Then, an anode electrode 398 which constitutes an electrode for the p⁺ type impurity region is formed.

In the above-mentioned example, although the p⁻ type substrate in which the p⁺ type impurity region has previously been formed is adhered with the CZ substrate, the formation of the p⁺ type impurity region can be made even after the CZ substrate is subjected to anisotropic etching and the $SiO_2$ film is then etched to have the surface of the p⁻ substrate exposed.

As a method of forming the p⁺ type impurity region, a boron or boron silicide layer is formed by the chemical gas-phase growth method, and then subjected to heat diffusion. At this time, it is preferable that the above method is conducted after removing the oxide film as much as possible so that an active clean surface is exposed.

In other words, after the $SiO_2$ film is etched to have the surface of the p⁻ substrate exposed, the substrate is submerged in a dilute hydrofluoric acid of 0.5% concentration to make the formation of a natural oxide film difficult. Thereafter, the substrate is heated and held within a vacuum device having a background vacuum degree of $10^{-4}$ Pa or less at 800° C. or more. Under this circumstance, hydrogen gas may be preferably introduced.

Thus, after the active surface is exposed, a boron compound gas such as $B_2H_6$ gas is introduced so that a boron or boron silicide film is formed as a diffusion source.

In this case, a film thus formed is different depending on substrate temperature, and a baron silicide film is formed from a $B_2H_6$ gas at 700° C. or more. This boron silicide film is more stable than a boron film and can perform a diffusion with high control performance. In this case, it is necessary to previously form a $Si_3N_4$ film, as a mask, on a surface of the p⁻ substrate where the n⁺ type impurity region is formed.

In accordance with the above-described method, a very shallow p⁺ type impurity region can be formed, and therefore there is the advantage that, when radiation or the like is incident from some surface of the p⁺ type impurity region, absorption of the radiation is reduced.

In the case where particle radiation, x-rays or the like such as electron radiation is incident, the $SiO_2$ film on that portion is necessarily removed, as described above.

If incident radiation is visible light, then it is preferable to form a $SiO_2$ film as a protective and non-reflection film.

When light or the like is incident from the side of the p⁻ substrate, it goes without saying that it is unnecessary to specially remove the CZ substrate by etching.

The present inventors have found that the avalanche photodiode thus obtained in accordance with the twentieth embodiment of the present invention has a linear position resolution, a sensitivity and a response speed which can be sufficient for practical use.

In the same manner, the avalanche photodiodes in accordance with the twenty-first and twenty-second embodiments of the present invention can be attained with a linear position resolution, a sensitivity and a response speed which can be sufficient for practical use.

In the case where the p⁻ substrate is thin, as described above, it is necessary to join the substrate to another substrate as a support substrate for reinforcement, thereby forming each impurity region and electrodes and the like. In such a situation, in the lamination type two-dimensional detection avalanche photodiodes shown in the twenty-third and twenty-fourth embodiments of the present invention, the support substrate, for example the CZ substrate, provides a dead space. Therefore, in this case, the CZ substrate is preferably made as shallow as possible, or is eliminated.

Figure 47:
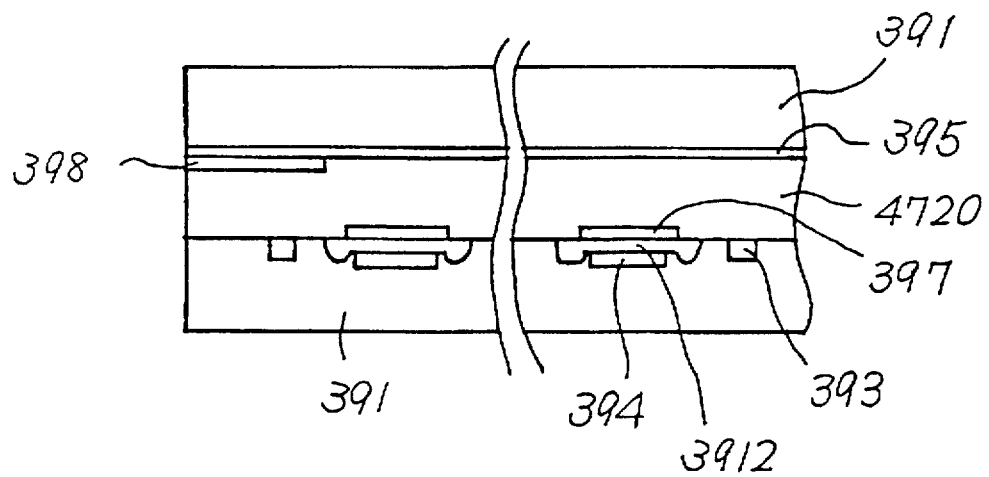
FIG. 47 is a schematic sectional view explanatory for a method of manufacturing an avalanche photodiode in accordance with the twenty-fourth and twenty-fifth embodiments of the present invention.

For that reason, as shown by a sectional view of FIG. 47, a thicker p⁻ substrate 391, in which a p⁺ type impurity region 395 and an anode electrode 398 have been formed in one surface in advance, and another thicker p⁻ substrate 391 are adhered with each other through an insulation film 4720 so that the p⁺ type impurity region 395 and the strip shaped n⁺ type impurity region 3912 are opposite to each other, and thereafter a surface where an impurity region is not formed is ground to a predetermined thickness, and a remaining impurity region is formed to laminate this two layer substrate.

Figure 48:
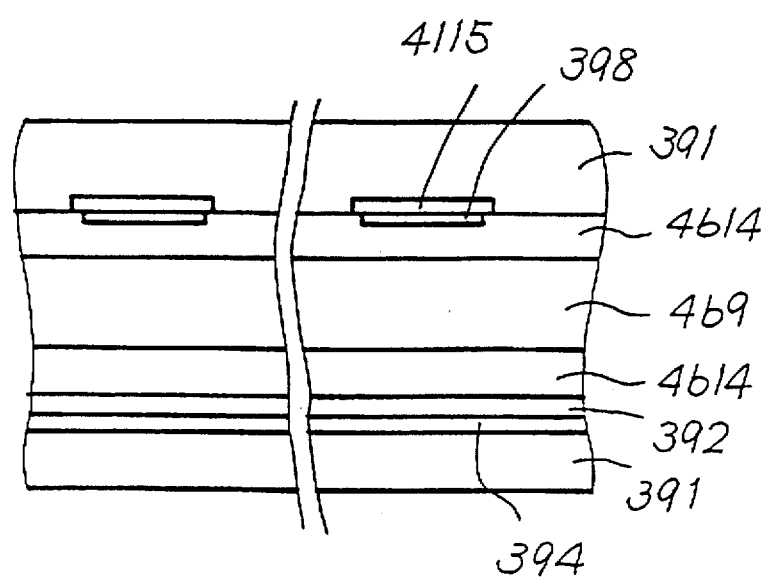
FIG. 48 is a schematic sectional view for explaining a part of another method of manufacturing an avalanche photodiode in accordance with the twenty-fourth and twenty-fifth embodiments of the present invention.
Figure 49:
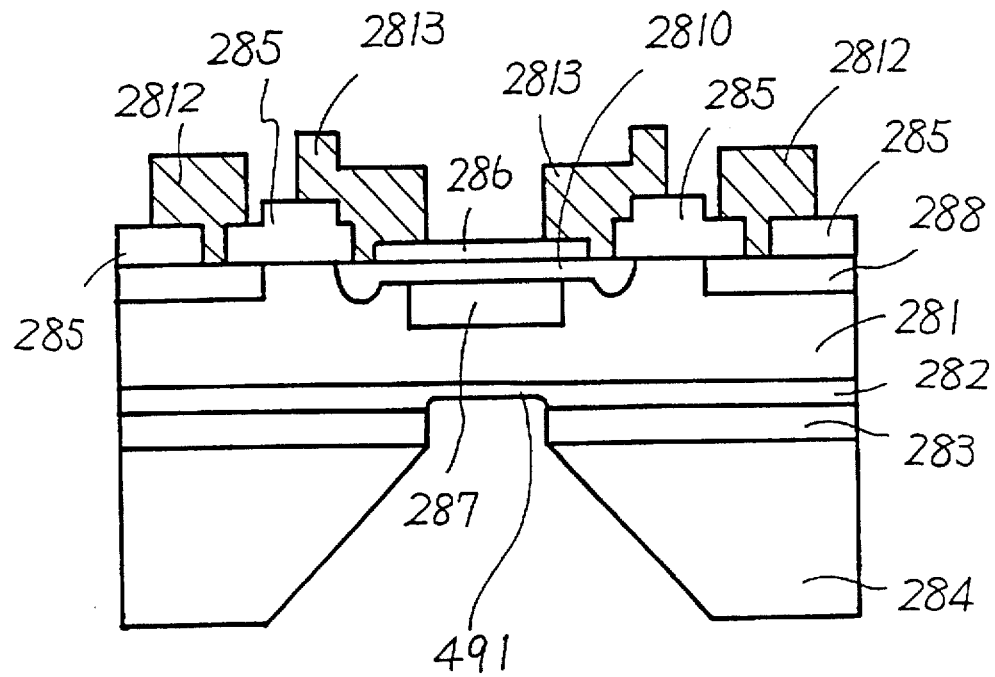
FIG. 49 is a schematic sectional view showing an avalanche photodiode having a thin part of $p^+$ type impurity region in a rear surface which is exposed by removal of part of a supported substrate.

Alternatively, as shown by a sectional view of FIG. 48, a thicker p⁻ substrate 391 in which any impurity region, for example a strip shaped p⁺ type impurity region 4115, and an anode electrode 398 are formed in any surface, and a CZ substrate in which an $SiO_2$ film 4614 is formed are adhered with each other, and the CZ substrate is made thinner by grinding to produce the $SiO_2$ film 4614. Furthermore, a thicker p⁻ type substrate 391, in which any impurity region, for example the n⁺ type impurity region 392 and the p type impurity region 394 and the like, are previously formed in any surface, is further adhered in such a manner that both surfaces of these layer substrates are ground to thereby provide a predetermined thickness, and thereafter a remaining impurity region and an electrode and the like are formed on both surfaces to as to laminate this three-layer substrate.

This method causes a little dead space, however, it is effective in a case where the p⁻ substrate is thin.

It is better to interpose Al between two substrates for light-shielding in order to improve position resolution with prevention of adverse effects of refracted rays and scattered rays.

The lamination type two-dimensional detection avalanche photodiodes thus obtained in accordance with the twenty-third and twenty-fourth embodiments of the present invention can provide a two-dimensional position resolution, a sensitivity and a response speed which can be sufficiently practical.

As described above, in accordance with the construction and the manufacturing method of the present invention, a photoelectric conversion semiconductor device can be realized with a reduced leakage current, a high sensitivity on the side of a shorter wavelength, a high function and a high performance.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A photoelectric conversion semiconductor device comprising:

a support substrate;

an insulation film formed on said support substrate;

a first silicon semiconductor substrate formed on said insulation film by a floating zone method; and an avalanche photodiode formed in said first monocrystalline silicon semiconductor substrate.

2. A device according to claim 1, wherein said support substrate comprises a second silicon semiconductor substrate crystal-grown by the Czochralski method.

3. A device according to claim 1, wherein said support substrate is provided with an opening.

4. A semiconductor photodiode according to claim 3, wherein said support substrate comrises a silicon semiconductor substrate of a face orientation (100).

5. A device according to claim 3 wherein said first silicon substrate has a rear surface which faces toward said support substrate, and said device further comprises an impurity layer on said rear surface of said first silicon substrate, said impurity layer having a first portion located in said opening and a second portion spaced from said opening, and said first portion being thinner than said second portion.

6. A device according to claim 3 wherein said first silicon substrate has a rear surface which faces toward said support substrate, said insulation film has an opening aligned with said opening in said support substrate to expose a part of said rear surface of said first silicon substrate, and said first silicon substrate is selectively doped with an impurity at the exposed part of said rear surface.

* * * * *